US007567451B2

(12) United States Patent
Koide

(10) Patent No.: US 7,567,451 B2
(45) Date of Patent: Jul. 28, 2009

(54) FERROELECTRIC MEMORY DEVICE AND ELECTRONIC EQUIPMENT

(75) Inventor: Yasunori Koide, Matsumoto (JP)

(73) Assignee: Seiko Epson Corporation (JP)

( * ) Notice: Subject to any disclaimer, the term of this patent is extended or adjusted under 35 U.S.C. 154(b) by 47 days.

(21) Appl. No.: 11/999,240

(22) Filed: Dec. 4, 2007

(65) Prior Publication Data

US 2008/0130347 A1 Jun. 5, 2008

(30) Foreign Application Priority Data

Dec. 4, 2006 (JP) ............................. 2006-326775
Sep. 13, 2007 (JP) ............................. 2007-238244

(51) Int. Cl.
*G11C 11/22* (2006.01)
(52) U.S. Cl. .......................... 365/145; 365/149; 365/65
(58) Field of Classification Search .................. 365/145, 365/149, 65, 63, 117
See application file for complete search history.

(56) References Cited

U.S. PATENT DOCUMENTS

| 5,901,077 | A | 5/1999 | Nishimura |
| 6,104,655 | A | 8/2000 | Tanoi et al. |
| 6,469,546 | B2 | 10/2002 | Matano |
| 7,443,708 | B2 * | 10/2008 | Madan et al. ............... 365/145 |
| 2002/0118577 | A1 | 8/2002 | Lim |
| 2005/0146913 | A1 | 7/2005 | Madan |
| 2005/0162942 | A1 | 7/2005 | Endo |

FOREIGN PATENT DOCUMENTS

| EP | 1465199 | 10/2004 |
| EP | 1622162 | 2/2006 |
| JP | 2000-133857 | 5/2000 |
| JP | 2000-149567 | 5/2000 |
| JP | 2000-187990 | 7/2000 |
| JP | 2001-332087 | 11/2001 |

OTHER PUBLICATIONS

Shoichiro Kawashima et al., "Bitline GND Sensing Technique for Low-Voltage Operation FeRAM", May 5, 2002, IEEE Journal of Solid-State Circuits, figures 3, 5.
Shoichiro Kawashima et al., "A Bit-Line GND Sense Technique for Low-Voltage Operation FeRAM", 2001 Symposium on VLSI Circuits Digest of Technical Papers, 2001, pp. 127-128.

* cited by examiner

*Primary Examiner*—David Lam
(74) *Attorney, Agent, or Firm*—Harness, Dickey & Pierce, P.L.C.

(57) ABSTRACT

A ferroelectric memory device, having: a first charge-transfer MISFET, connected between a first bit line and a first node; a second charge-transfer MISFET, connected between a second bit line and a second node; a first capacitance, connected to the first node; a second capacitance, connected to the second node; a first p-channel MISFET, connected between the first charge-transfer MISFET and the first node, and the gate electrode of which is connected to the second node; and a second p-channel MISFET, connected between the second charge-transfer MISFET and the second node, and the gate electrode of which is connected to the first node.

25 Claims, 23 Drawing Sheets

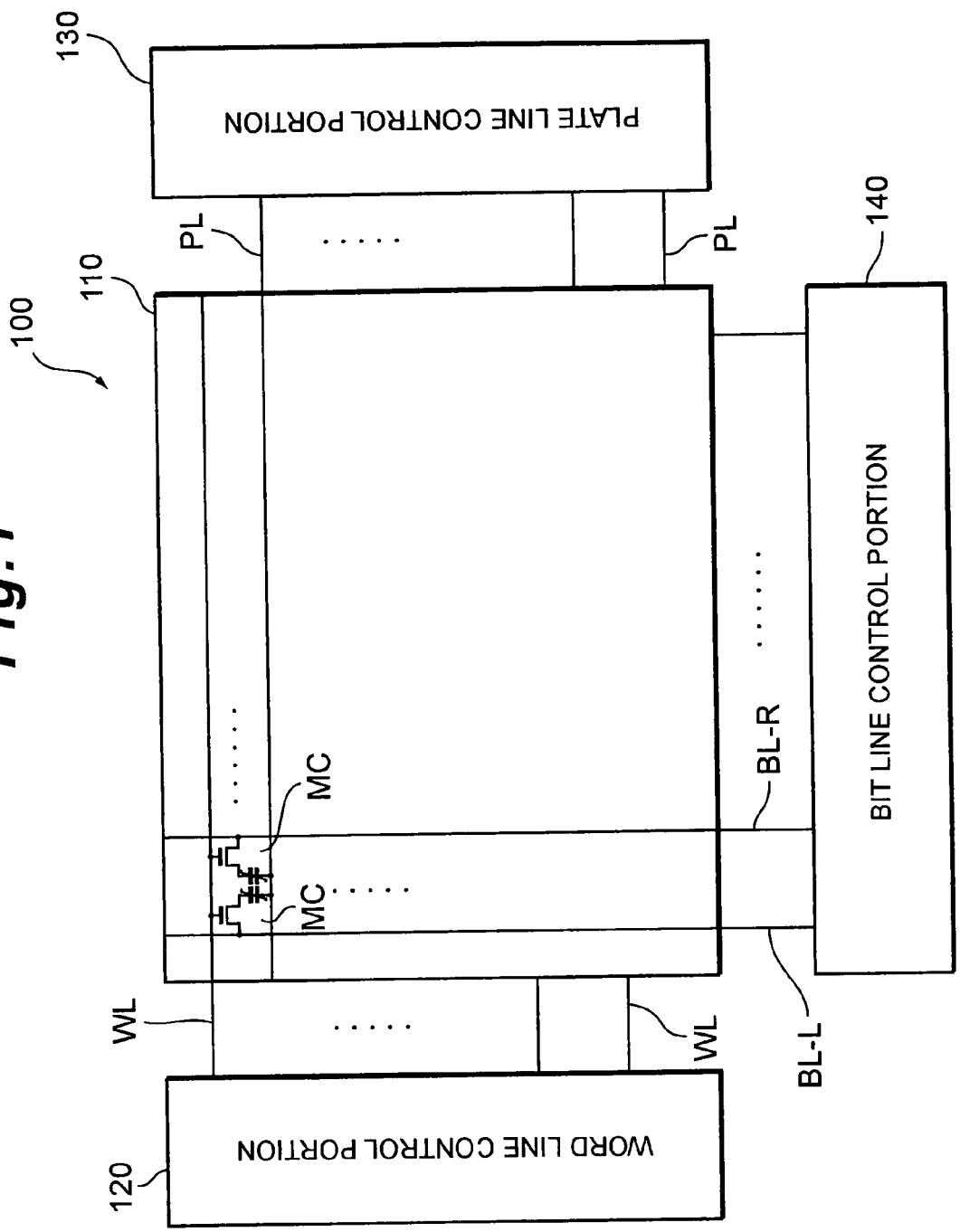

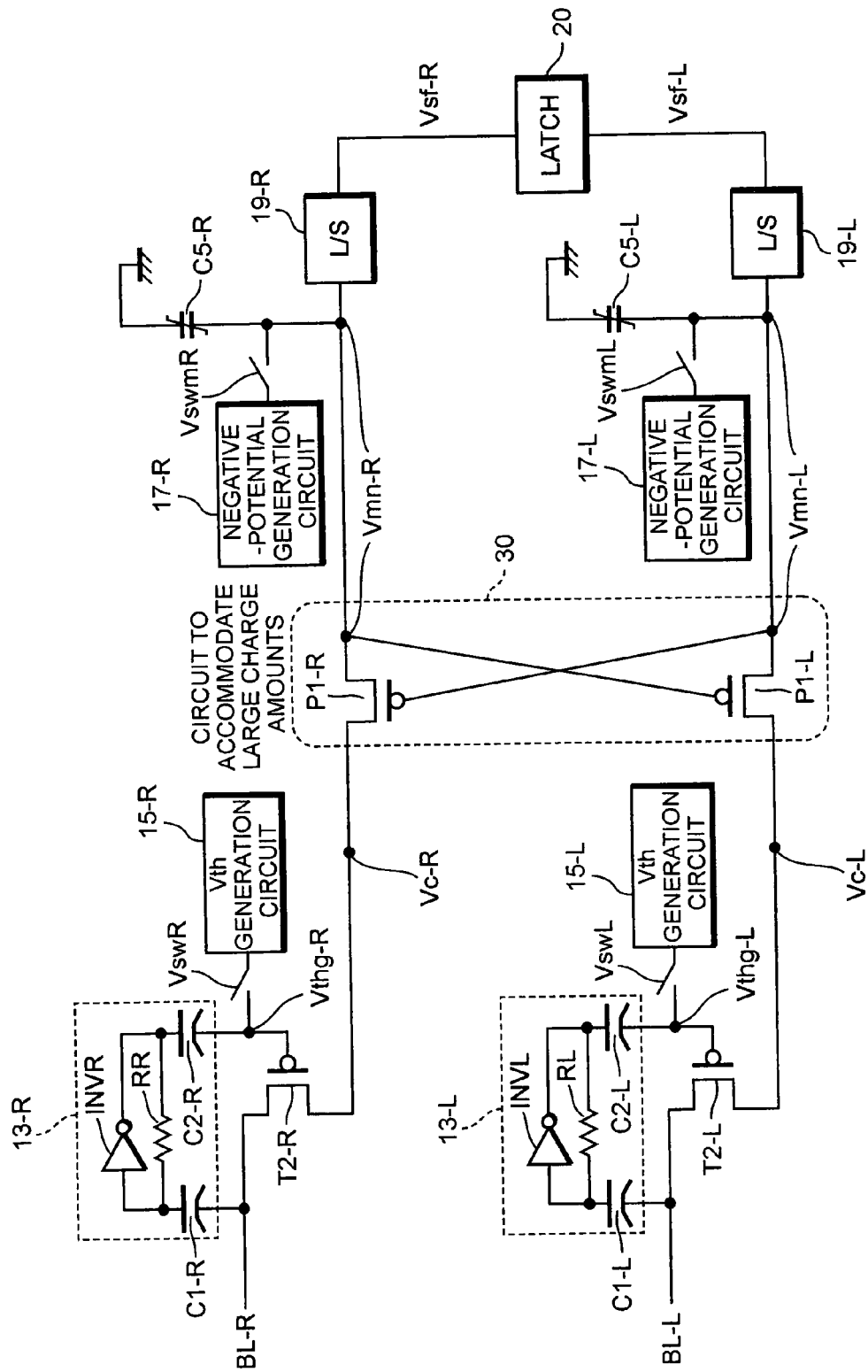

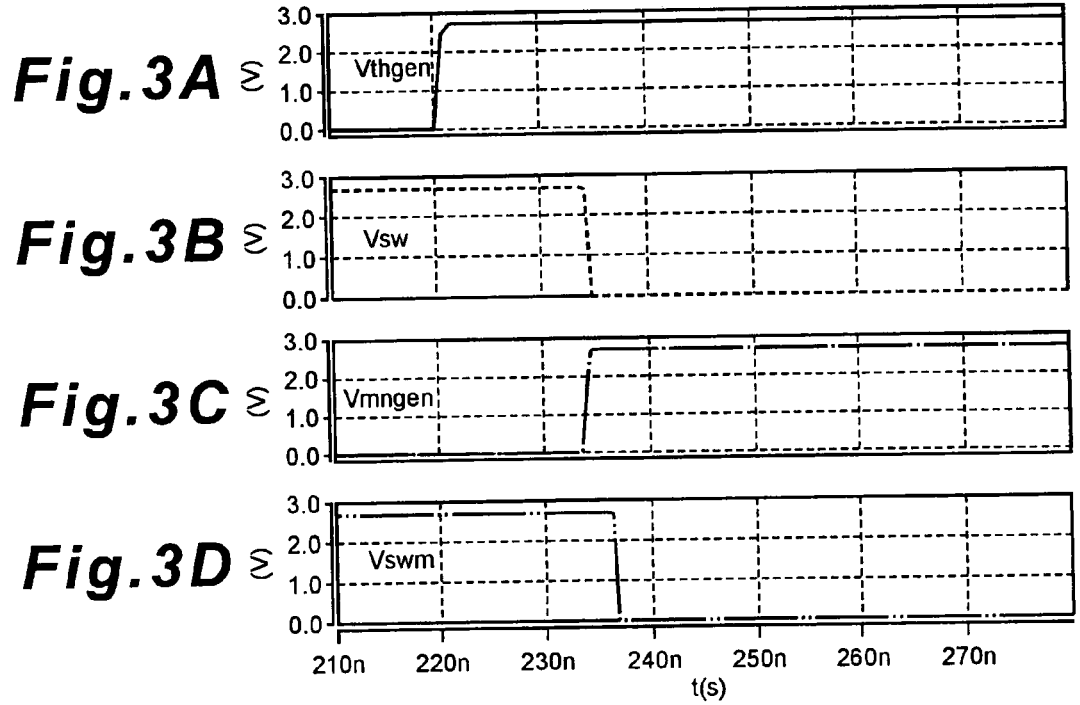
Fig. 3A
Fig. 3B
Fig. 3C
Fig. 3D
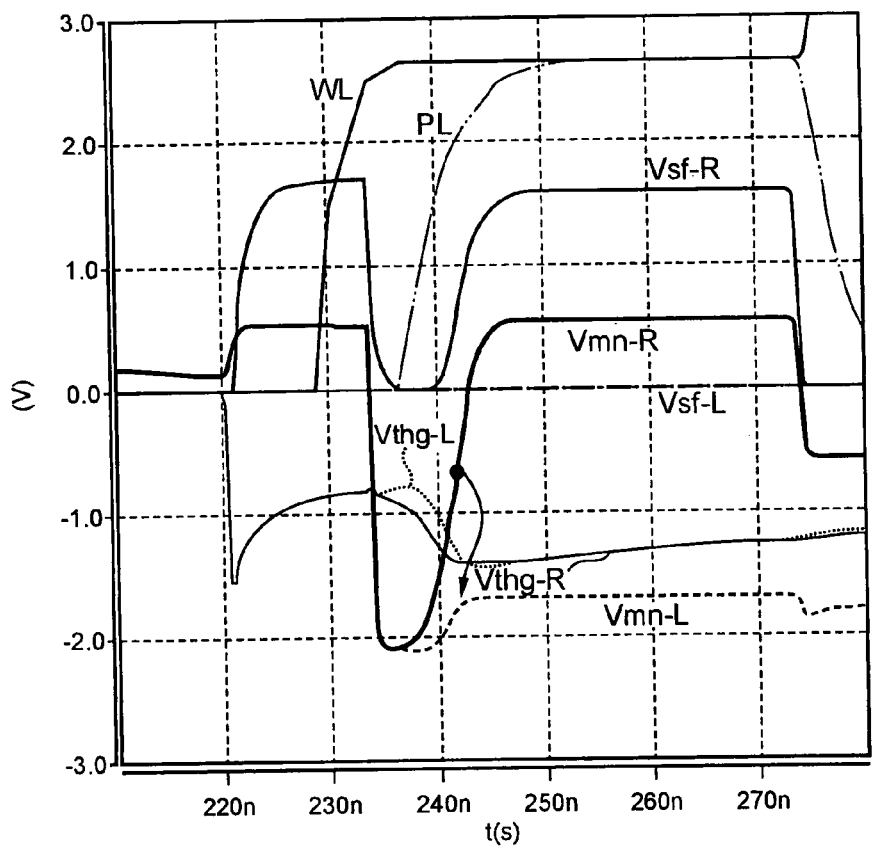
Fig. 4

FERROELECTRIC MEMORY DEVICE AND ELECTRONIC EQUIPMENT

This application claims priority from Japanese Patent Application No. 2006-326775, filed on Dec. 4, 2006, and from Japanese Patent Application No. 2007-238244, filed on Sep. 13, 2007, the contents of which are incorporated herein.

BACKGROUND

1. Technical Field

The present invention relates to a ferroelectric memory device (a ferroelectric storage device), and in particular to a read circuit of a ferroelectric memory device.

2. Related Art

In order to read ferroelectric random access memory (Fe-RAM), a method employing a latch-type sense amplifier circuit is widely used (see for example JP-A-2000-187990).

However, in this case, the voltage applied to the plate line is voltage-divided between the ferroelectric capacitor capacitance (Cs) and the bit line capacitance (Cbl). Hence an adequate potential is not applied to ferroelectric capacitors by the bit line capacitance (Cbl). Further, because differences in bit line voltages are amplified by a sense amplifier and read, the more the bit line capacitance (Cbl) increases, the smaller is the bit line voltage, so that the sense margin decreases.

Hence read circuits are being studied which can fix bit lines at virtual ground potentials (see for example JP-A-2002-133857).

However, even when using a circuit according to the above JP-A-2002-133857 or similar, as is explained in detail below, readout margins decline (1) when the ferroelectric capacitor capacitance of memory cells deviates greatly from an initial setting, and (2) when the ratio of the memory ferroelectric capacitor capacitance to a tank capacitance changes prominently.

Further, it is important that (3) the readout margin be improved while improving error judgment. Particularly when reading from ferroelectric memory cells, data "0", for which the charge amount is inherently small, is rapidly transferred to the bit line, and there are cases in which the potential of data "0" is temporarily reversed to the potential of data "1". In such a reversed state, if the potential difference between the potentials of data "0" and data "1" is expanded, error judgments tend to occur.

SUMMARY

Hence an advantage of some aspects of the invention is an improvement in readout margin of a ferroelectric memory device. And, a further advantage of some aspects of the invention is improvement of the readout characteristics of a ferroelectric memory device.

(1) A ferroelectric memory device of this invention has a first charge-transfer MISFET, connected between a first bit line and a first node; a second charge-transfer MISFET, connected between a second bit line and a second node; a first capacitance, connected to the first node; a second capacitance, connected to the second node; a first p-channel MISFET, connected between the first charge-transfer MISFET and the first node, and the gate electrode of which is connected to the second node; and a second p-channel MISFET, connected between the second charge-transfer MISFET and the second node, and the gate electrode of which is connected to the first node.

By means of this configuration, even when the ferroelectric capacitor capacitance of memory cells is increased, an increase in the potential of one among the first and second nodes is suppressed by the first and second p-channel MISFETs, so that a large potential difference therebetween can be secured.

(2) It is preferable that the first and second charge-transfer MISFETs both be p-channel MISFETs.

(3) It is preferable that the ferroelectric memory device further have a first inverter, being a first inverter connected between the first bit line and the gate electrode of the first charge-transfer MISFET, the input portion of which is connected to the first bit line with a third capacitance intervening, and the output portion of which is connected to the gate electrode of the first charge-transfer MISFET with a fourth capacitance intervening; and a second inverter, being a second inverter connected between the second bit line and the gate electrode of the second charge-transfer MISFET, the input portion of which is connected to the second bit line with a fifth capacitance intervening, and the output portion of which is connected to the gate electrode of the second charge-transfer MISFET with a sixth capacitance intervening. By means of this configuration, the potentials of the first and second bit lines can be fed back to the gate electrodes of the first and second charge-transfer MISFETs, and bit lines can be fixed more firmly at ground potential.

(4) For example, a ferroelectric memory device has a third p-channel MISFET, connected between the first connection node between the first charge-transfer MISFET and the first p-channel MISFET, and a ground potential; and a fourth p-channel MISFET, connected between the second connection node between the second charge-transfer MISFET and the second p-channel MISFET, and a ground potential.

By means of this configuration, even when the ferroelectric capacitor capacitance of a memory cell has become small, the potential of one among the first and second nodes can be raised by means of the third and fourth p-channel MISFETs, so that a large potential difference therebetween can be secured. (5) The third and fourth p-channel MISFETs are controlled so as to be in the on state after a fixed interval from the start of a readout operation of the device.

(6) For example, a ferroelectric memory device further has a first n-channel MISFET, connected between the output portion of the first inverter and a ground potential, and a second n-channel MISFET, connected between the output portion of the second inverter and a ground potential.

By means of this configuration, even when the ferroelectric capacitor capacitance of a memory cell has become small, the potential of one among the first and second nodes can be raised by the first and second n-channel MISFETs, so that a large potential difference therebetween can be secured. (7) The first and second n-channel MISFETs are controlled so as to be in the on state after a fixed interval from the start of a readout operation of the device.

(8) For example, a ferroelectric memory device further has a fifth p-channel MISFET connected between the input portion of the first inverter and a power supply potential, and a sixth p-channel MISFET connected between the output portion of the second inverter and a power supply potential.

By means of this configuration, even when the ferroelectric capacitor capacitance of a memory cell has become small, the potential of one among the first and second nodes can be raised by the fifth and sixth p-channel MISFETs, so that a large potential difference therebetween can be secured. (9) The fifth and sixth p-channel MISFETs are controlled so as to be in the on state after a fixed interval from the start of a readout operation of the device.

(10) For example, the first and second capacitances are ferroelectric capacitances. By means of this configuration, large capacitance can be secured in a small area.

(11) For example, the first and second capacitances are gate capacitances. By means of this configuration, capacitances can be formed with good controllability.

(12) For example, the first bit line and second bit line are each connected to ferroelectric memory. By means of this configuration, this invention can be applied to so-called 2T2C ferroelectric memory cells.

(13) For example, the first bit line is connected to ferroelectric memory, and a reference potential is applied to the second bit line. By means of this configuration, this invention can be applied to so-called 1T1C ferroelectric memory cells.

(14) Electronic equipment of this invention has a ferroelectric memory device described above. By means of this configuration, characteristics of the electronic equipment can be improved. Here, "electronic equipment" refers to equipment incorporating a ferroelectric memory device of this invention and exhibiting fixed functions; while no limitations in particular are placed on the equipment configuration, such equipment may for example include, as equipment incorporating an above-described ferroelectric memory device, general computer equipment, portable telephones, PHS units, PDAs, electronic personal organizers, IC cards, and any other device which requires a memory device.

(15) A ferroelectric memory device of this invention has a first p-channel MISFET, connected between a first node and a third node, the gate electrode of which is connected to a second node; a second p-channel MISFET, connected between the second node and a fourth node, the gate electrode of which is connected to the first node; a first charge-transfer MISFET, connected between a first bit line and the third node; a second charge-transfer MISFET, connected between a second bit line and the fourth node; a first control circuit, which is connected between the first bit line and a first gate electrode of the first charge-transfer MISFET, and which controls a potential applied to the first gate electrode according to the potential of the first bit line; a second control circuit, which is connected between the second bit line and a second gate electrode of the second charge-transfer MISFET, and which controls a potential applied to the second gate electrode according to the potential of the second bit line; a first capacitance, connected to the first node; a second capacitance, connected to the second node; a first negative-potential generation circuit, connected to the first bit line; and a second negative-potential generation circuit, connected to the second bit line.

By means of this configuration, a rise in the potential of one among the first and second nodes is suppressed by the first and second p-channel MISFETs, so that a large potential difference therebetween can be secured, and the readout margin can be improved. Further, by sharply dropping the potential of the first and second bit lines by means of the first and second negative-potential generation circuits, operation of the first and second p-channel MISFETs in the initial readout period can be limited, and erroneous judgments can be alleviated.

(16) It is preferable that the first and second charge-transfer MISFETs both be p-channel MISFETs.

(17) It is preferable that the first control circuit have a first inverter, connected between the first bit line and the gate electrode of the first charge-transfer MISFET, the input portion of which is connected to the first bit line via a third capacitance, and the output portion of which is connected to the gate electrode of the first charge-transfer MISFET via a fourth capacitance, and that the second control circuit have a second inverter, connected between the second bit line and the gate electrode of the second charge-transfer MISFET, the input portion of which is connected to the second bit line via a fifth capacitance, and the output portion of which is connected to the gate electrode of the second charge-transfer MISFET via a sixth capacitance. By means of this configuration, the potential of the first and second bit lines can be fed back to the gate electrodes of the first and second charge-transfer MISFETs.

(18) It is preferable that the first negative-potential generation circuit have a seventh capacitance, connected between the first bit line and a first signal line, and that the second negative-potential generation circuit have an eighth capacitance, connected between the second bit line and the first signal line. By means of this configuration, a negative potential can easily be generated through a simple configuration.

(19) For example, the seventh and eighth capacitances may be ferroelectric capacitances. In this way, ferroelectric capacitances may be used as capacitances.

(20) It is preferable that the first bit line and second bit line be each connected to ferroelectric memory; the seventh and eighth capacitances have substantially the same capacitance as the ferroelectric capacitances of the ferroelectric memories. By means of this configuration, data "0" charge is cancelled, and when a bit line is raised to positive potential, reversal between the data "0" potential and data "1" potential is corrected.

(21) For example, a ferroelectric memory device further has a first n-channel MISFET connected between the output portion of the first inerter and a ground potential, and a second n-channel MISFET connected between the output portion of the second inverter and a ground potential.

By means of this configuration, the potential of one among the first and second nodes can be raised by the first and second n-channel MISFETs.

(22) For example, a ferroelectric memory device further has a third n-channel MISFET connected between the output portion of the first inverter and the first n-channel MISFET, and the gate electrode of which is connected to the input portion of the first inverter, and a fourth n-channel MISFET connected between the output portion of the second inverter and the second n-channel MISFET, and the gate electrode of which is connected to the input portion of the second inverter.

By means of this configuration, the potential of one among the first and second modes can be raised by the third and fourth n-channel MISFETs, while reflecting the potential difference between the first and second bit lines.

(23) It is preferable that the first and second n-channel MISFETs be controlled so as to be in the on state after a fixed interval from the start of operations of the first and second negative-potential generation circuits respectively. According to this configuration, by means of the first and second negative-potential generation circuits, operation of the first and second p-channel MISFETs in the initial readout period can be limited, and moreover, during a fixed interval, reversal between data "0" potential and data "1" potential can be corrected, and based on the corrected appropriate potential difference, the potential of one among the first and second nodes can be raised. Hence erroneous judgment can be prevented while improving the readout margin.

(24) For example, a ferroelectric memory device has a third charge-transfer MISFET connected in parallel with the first charge-transfer MISFET, and the gate electrode of which is connected to a second signal line, and a fourth charge-transfer MISFET connected in parallel with the second charge-transfer MISFET, and the gate electrode of which is connected to the second signal line.

By means of this configuration, the potential of one among the first and second nodes can be raised by the third and fourth charge-transfer MISFETs.

(25) For example, a ferroelectric memory device has a third p-channel MISFET connected between the third node and a ground potential, and the gate electrode of which is connected to the second signal line, and a fourth p-channel MISFET connected between the fourth node and a ground potential, and the gate electrode of which is connected to the second signal line. The third node is a connection node between the first charge-transfer MISFET and the first p-channel MISFET. And, the fourth node is a connection node between the second charge-transfer MISFET and the second p-channel MISFET.

By means of this invention, the potential of one among the first and second nodes can be raised by the third and fourth p-channel MISFETs.

(26) For example, a ferroelectric memory device has a fifth p-channel MISFET connected between the input portion of the first inverter and a power supply potential, and the gate electrode of which is connected to the second signal line, and a sixth p-channel MISFET connected between the input portion of the second inverter and a power supply potential, and the gate electrode of which is connected to the second signal line.

By means of this configuration, the potential of one among the first and second nodes can be raised by the fifth and sixth p-channel MISFETs.

(27) It is preferable that the potential of the second signal line be controlled so as to change after a fixed interval from the start of operations of the first and second negative-potential generation circuits respectively.

By means of this configuration, operation of the first and second p-channel MISFETs in the initial readout period can be limited, and moreover, during a fixed interval, reversal between data "0" potential and data "1" potential can be corrected, and based on the corrected appropriate potential difference, the potential of one among the first and second nodes can be raised. Hence erroneous judgment can be prevented while improving the readout margin.

(28) For example, ferroelectric memories are connected to both the first bit line and the second bit line. By means of this configuration, this invention can be applied to so-called 2T2C ferroelectric memory cells.

(29) For example, ferroelectric memory is connected to the first bit line, and a reference potential is applied to the second bit line. By means of this configuration, this invention can be applied to so-called 1T1C ferroelectric memory cells.

(30) Electronic equipment of this invention has an above-described ferroelectric memory device. By means of this configuration, electronic equipment characteristics can be improved.

BRIEF DESCRIPTION OF THE DRAWINGS

FIG. 1 is a block diagram showing the configuration of a ferroelectric memory device;

FIG. 2 is a circuit diagram showing the configuration of the sense amplifier circuit (readout circuit) of Embodiment 1;

FIG. 3 shows a readout timing chart of a ferroelectric memory device;

FIG. 4 shows a readout timing chart of a ferroelectric memory device;

DESCRIPTION OF EXEMPLARY EMBODIMENTS

Figure 5:
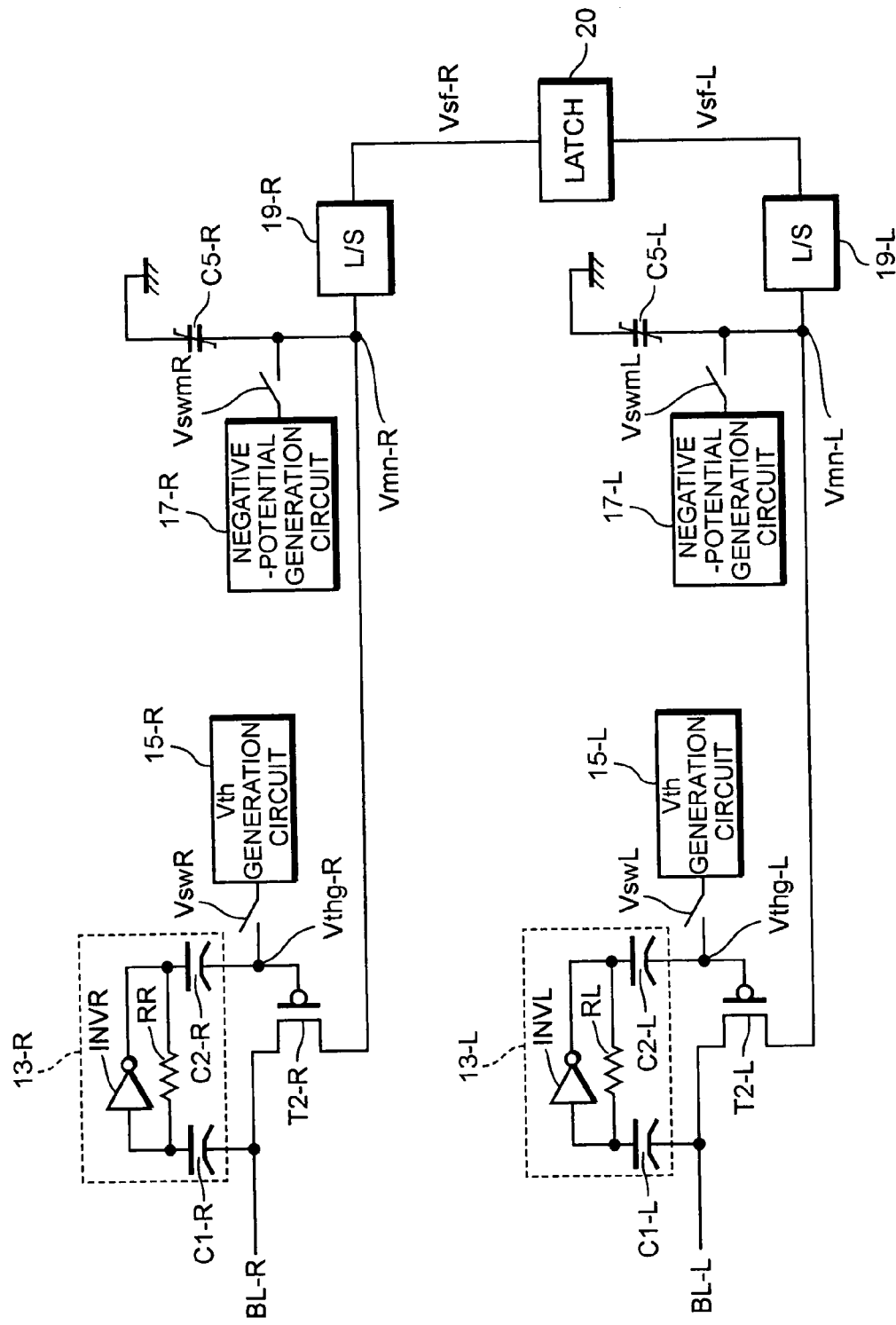
FIG. 5 shows the configuration of a sense amplifier circuit when cross-connected p-channel MISFETs P1-L, P1-R are not used.

Below, embodiments of the invention are explained in detail, referring to the drawings. Portions having the same functions are assigned the same or related symbols, and repeated explanations are omitted.

Embodiment 1

FIG. 1 is a block diagram showing the configuration of a ferroelectric memory device. As shown in the figure, the ferroelectric memory device 100 has a memory cell array 110 and peripheral circuit portions (120, 130, 140, and similar). The memory cell array 110 is constituted by a plurality of memory cells arranged in an array; each memory cell is positioned at the intersection of a word line WL and bit lines BL-L, BL-R. Here, an example of 2T2C cells is explained. Hence one data item is stored by two transistors and two ferroelectric capacitors, each connected to one of the bit lines BL-L and BL-R. The word line control portion 120 and plate line control portion 130 in the peripheral circuitry control the plurality of word lines WL and the plurality of plate lines PL. By means of this control, data stored in memory cells MC is read out to a plurality of bit lines BL, and data supplied from an external source is written via bit lines BL to memory cells MC. This reading and writing is performed in the bit line control portion 140.

FIG. 2 is a circuit diagram showing the configuration of the sense amplifier circuit (readout circuit) of this embodiment.

As shown in the figure, bit lines BL-L and BL-R are connected, via the p-channel MISFETs (charge-transfer MISFET: Metal Insulator Semiconductor Field Effect Transistor) T2-L and T2-R, to the first node Vmn-L and second node Vmn-R, respectively.

On the other hand, between the first node Vmn-L and second node Vmn-R, and ground potential (reference potential GND, Vss), tank capacitances C5-L and C5-R are respectively connected. Further, the first node Vmn-L and second node Vmn-R are connected to the negative-potential generation circuits 17-L, 17-R via the switching transistors VswmL and VswmR respectively. Here, as the tank capacitances C5-L and C5-R, ferroelectric capacitances are used; however, paraelectric capacitances may be used as well. However, if ferroelectric capacitances are used, large capacitance values can be obtained from a small area.

By means of the above configuration, even when potentials are transferred from memory cells to bit lines BL-L and BL-R, by transferring negative charge stored in the first and second tank capacitances via the p-channel MISFETs T2-L and T2-R, the bit lines can be fixed at virtual ground potential. Hence most of the readout potential applied to plate lines can be applied to the ferroelectric capacitors of memory cells, and the readout margin can be improved. Moreover, the readout speed can be improved. And, because the influence of bit line capacitances can be decreased, the above satisfactory characteristics can be maintained even when bit line lengths increase as the bit number of the memory is increased.

Below, the circuit of FIG. 2 is explained in still more detail.

The gate electrodes (nodes Vthg-L, Vthg-R) of the p-channel MISFETs T2-L, T2-R are connected, via the switching transistors VswL, VswR, to the threshold potential (Vth) generation circuits 15-L, 15-R, respectively.

Inverter amplifier circuits 13-L, 13-R are connected between the bit lines BL-L, BL-R and the gate electrodes of the p-channel MISFETs T2-L, T2-R, respectively. The inverter amplifier circuits 13-L, 13-R are formed from inverters INVL, INVR, capacitances C1-L, C1-R, C2-L, C2-R, and resistances RL, RR.

Specifically, the bit line BL-L and the input portion of the inverter INVL are connected via capacitance C1-L, and the gate electrode of the p-channel MISFET T2-L and the output portion of the inverter INVL are connected via capacitance C2-L. Also, the input portion and output portion of the inverter INVL are connected via resistance RL.

Similarly, the bit line BL-R and the input portion of inverter INVR are connected via capacitance C1-R, and the gate electrode of the p-channel MISFET T2-R and the output portion of inverter INVR are connected via capacitance C2-R. Also, the input portion and output portion of the inverter INVR are connected via resistance RR.

The inverter amplifier circuits 13-L, 13-R use paraelectric capacitances as the capacitances C1-L, C1-R, C2-L, C2-R, but ferroelectric capacitances may also be used. These inverter amplifier circuits 13-L, 13-R serve to fix the bit lines more firmly at ground potential, by feeding back the bit line potentials to the gate electrodes of the p-channel MISFETs.

Further, the first node Vmn-L and second node Vmn-R are connected to positive-potential conversion circuits (L/S) 19-L, 19-R, and the potential difference between the outputs (signals) therefrom Vsf-L, Vsf-R is judged by a latch circuit 20 to perform readout.

In this embodiment, the p-channel MISFETs P1-L, P1-R are connected between the p-channel MISFETs T2-L, T2-R and the first and second nodes Vmn-L, Vmn-R, respectively. Further, the gate electrode of the p-channel MISFET P1-L is connected to the second node Vmn-R, and the gate electrode of the p-channel MISFET P1-R is connected to the first node Vmn-L. These cross-connected p-channel MISFETs P1-L and P1-R form the circuit 30. As explained below, this circuit 30 can be regarded as a circuit to accommodate large amounts of charge on ferroelectric capacitors.

Next, readout operation of the above ferroelectric memory device having a sense amplifier circuit is explained. FIG. 3 and FIG. 4 are readout timing charts (potential simulations) for the ferroelectric memory device.

As shown in FIG. 3A, the control signal Vthgen of the threshold potential generation circuits 15-L, 15-R is set to H level (high potential level), and the threshold potential of the p-channel MISFETs T2-L, T2-R, is output from the threshold potential generation circuits 15-L, 15-R. At this time, the control signal Vsw common to the switching transistors VswL, VswR is at H level, and the switching transistors VswL, VswR are in the on state (see FIG. 3B). Hence the threshold potential is supplied to the gates of the p-channel MISFETs T2-L, T2-R. Next, the potential of the word line WL is set to H level.(see WL in FIG. 4).

Further, the control signal Vsw is set to L level (low potential level), and the switching transistors VswL, VswR are put into the off state. As a result, nodes Vthg-L, Vthg-R enter a floating state.

Next, the control signal Vmngen of the negative-potential generation circuits 17-L, 17-R is set to H level, and a negative potential is output from the negative potential generation circuits 17-L and 17-R. At this time, the control signal Vswm common to the switching transistors VswmR, VswmL is at H level, and the switching transistors VswmR, VswmL are in the on (conducting) state (see FIG. 3D). Hence the first node Vmn-L and second node Vmn-R are at negative potential. In other words, the tank capacitances C5-L, C5-R accumulate negative charge.

Next, the control signal Vswm is set to L level and the switching transistors VswmR, VswmL are put into the off state. As a result, the first node Vmn-L and second node Vmn-R enter a floating state.

Next, the plate line PL is set to H level (see PL in FIG. 4). As a result, memory cell charge is read. In other words, memory cell charge is transferred to the bit lines BL-L, BL-R.

By means of the above charge transfer, the potential of the bit lines BL-L, BL-R rises. This potential increase acts to reduce the potential at the nodes Vthg-L, Vthg-R through inverse-phase amplification by the inverter amplifiers 13-L, 13-R. This amount of potential change (potential drop) depends on the amount of change in the potential of the bit lines (potential rise). That is, the amount depends on the difference in charge amounts for data "0" and data "1" of the memory cells.

Here, when the potential at nodes Vthg-L, Vthg-R declines, the p-channel MISFETs T2-L, T2-R are turned on. Hence charge is transferred from the bit lines BL-L, BL-R to the tank capacitances C5-L, C5-R, which are charged at negative potential. That is, the potential of the first node Vmn-L and second node Vmn-R rises. When all of the memory cell charge is transferred to the tank capacitances C5-L, C5-R, the potential on the bit lines BL-L, BL-R drops, the potential on the nodes Vthg-L, Vthg-R rises, and the p-channel MISFETs T2-L, T2-R are turned off. Hence the increase in potential of the first node Vmn-L and second node Vmn-R stops. At this time, potential changes of the nodes Vthg-L, Vthg-R differ depending on the memory cell data "0" and data "1" charge amounts, and corresponding to this, the amounts of increase in potential of the first node Vmn-L and the second node Vmn-R differ. That is, due to the difference in charge amounts for data "0" and data "1", a potential difference occurs between the first node Vmn-L and the second node Vmn-R.

In this embodiment, as explained above, in the sense amplifier circuit the p-channel MISFETs P1-L, P1-R (30) are cross-connected, so that the following operation results.

That is, among the first node Vmn-L and second node Vmn-R, the node at higher potential is the first to reach the threshold potential (Vth) of the p-channel MISFETs P1-L, P1-R, and so turns off the other p-channel MISFET. In FIG. 4, the second node Vmn-R has reached the threshold potential (here, −0.7 V) first, and so the p-channel MISFET P1-L is turned off. As a result, the increase in potential of the first node Vmn-L stops (see FIG. 4, Vmn-R, Vmn-L).

Thus in this embodiment, an increase in the potential of one among the first node Vmn-L and the second node Vmn-R is suppressed, regardless of the potential for the nodes Vthg-L and Vthg-R, so that a large potential difference between the nodes can be secured. Hence the readout margin can be improved.

Below, advantageous results of this embodiment are explained in further detail, referring to the comparison circuit (FIG. 5).

FIG. 5 shows the configuration of the sense amplifier circuit when cross-connected p-channel MISFETs P1-L, P1-R are not used. Portions which are the same as in FIG. 2 are assigned the same symbols, and detailed explanations are omitted. In the circuit shown in FIG. 5, the p-channel MISFETs T2-L and T2-R are directly connected to the first node Vmn-L and second node Vmn-R respectively.

In this circuit, the readout margin is reduced (1) when the memory cell ferroelectric capacitor capacitance deviates greatly from the initial setting, and (2) when the ratio of the memory cell ferroelectric capacitor capacitance and the tank capacitance changes markedly.

Figure 6:
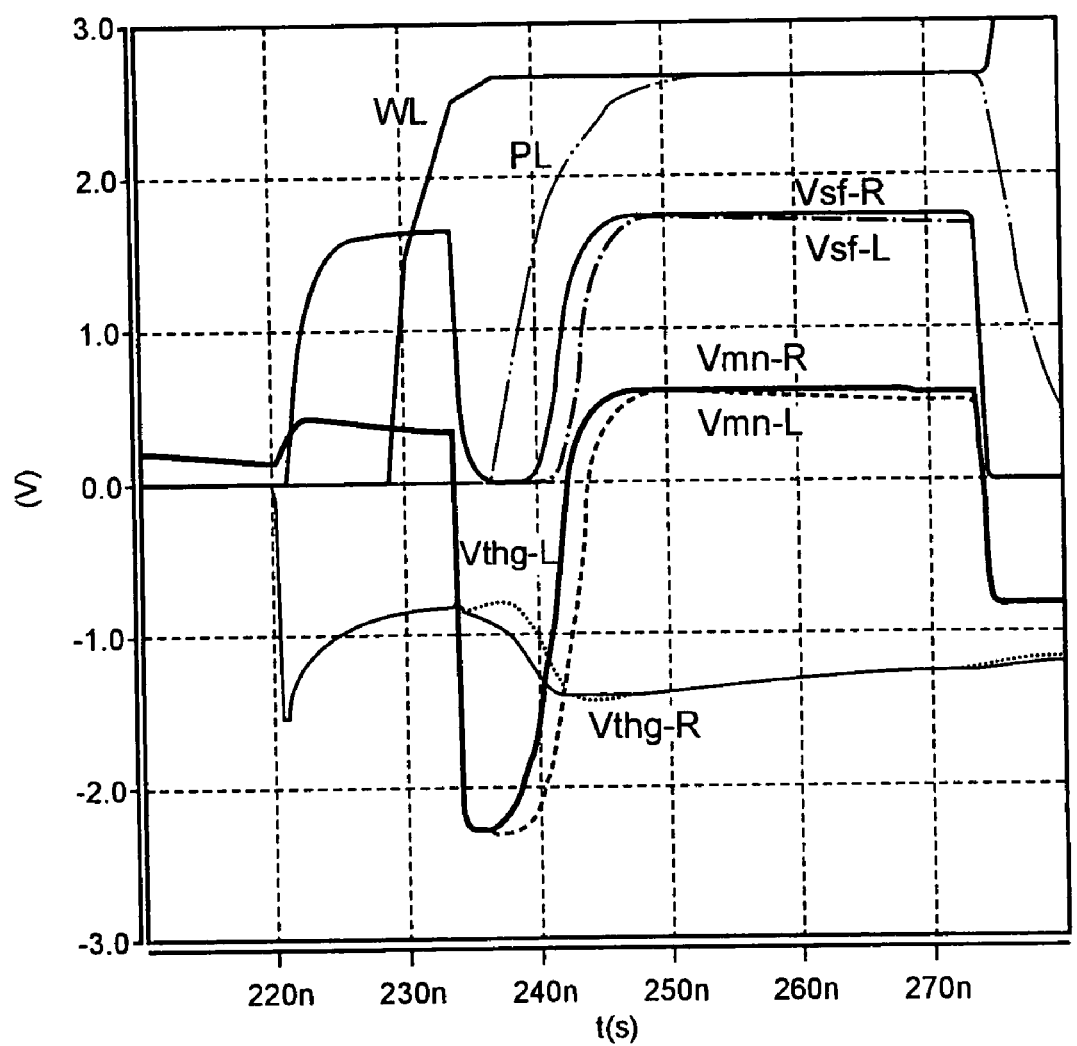
FIG. 6 shows the results of simulations when, in the comparison circuit shown in FIG. 5, the ferroelectric capacitor capacitance of memory cells is large.

For example, FIG. 6 shows simulations results when the memory cell ferroelectric capacitor capacitance (charge amount for data "0") is large. In this case, the memory cell ferroelectric capacitor capacitance can be said to be relatively large compared with the tank capacitance.

In this case, as shown in FIG. 6, the potential at the first node Vmn-L corresponding to data "0" increases greatly. On the other hand, the potential at second node Vmn-R corresponding to data "1" only rises to the prescribed potential (in this case, 0.7 V), so that the potential difference between the first node Vmn-L and the second node Vmn-R becomes small. Hence corresponding to this, the potential difference between the outputs Vsf-L and Vsf-R of the positive-potential conversion circuits 19-L and 19-R also become small. In positive-potential conversion, normally a conversion loss occurs, so that the potential difference becomes smaller still.

On the other hand, as explained above, in this embodiment rises in the potential of one among the first node Vmn-L and the second node Vmn-R (in FIG. 4, Vmn-L) are suppressed, and so a large potential difference between these nodes can be secured. In other words, the potential difference between the first node Vmn-L and the second node Vmn-R can be made equal to or greater than Vth. Hence the potential difference between the outputs Vsf-L and Vsf-R of the positive-potential conversion circuits 19-L, 19-R can be increased. That is, because the potentials of the first node Vmn-L and second node Vmn-R are negative potentials, they must be converted into positive potentials, and the difference must be latched. Hence the latch circuit 20 is turned on a prescribed time after the potential difference between the outputs Vsf-L and Vsf-R of the positive-potential conversion circuits 19-L, 19-R has become large, and the readout signal is output as a digital signal (H or L).

In this way, the potential difference between the outputs Vsf-L and Vsf-R of the positive-potential conversion circuits 19-L, 19-R can be made large. Further, because a potential difference at least equal to Vth is secured, the potential difference between the outputs Vsf-L and Vsf-R can be made large regardless of the positive-potential conversion circuit settings (conversion loss).

As explained in detail above, by means of this embodiment the readout margin can be improved. Further, readout characteristics can be improved. In FIG. 4 and FIG. 6, changes in the potentials of nodes Vthg-L and Vthg-R are also shown.

Embodiment 2

In Embodiment 1, measures were explained for cases in which the memory cell ferroelectric capacitor capacitance (data "0" charge amount) is large; in this embodiment, measures are explained for cases in which the ferroelectric capacitor capacitance (data "1" charge amount) is small. This may be regarded as a case in which the memory cell ferroelectric capacitor capacitance is relatively small compared with the tank capacitance. Portions which are the same as in Embodiment 1 are assigned the same symbols, and detailed explanations are omitted.

Figure 7:
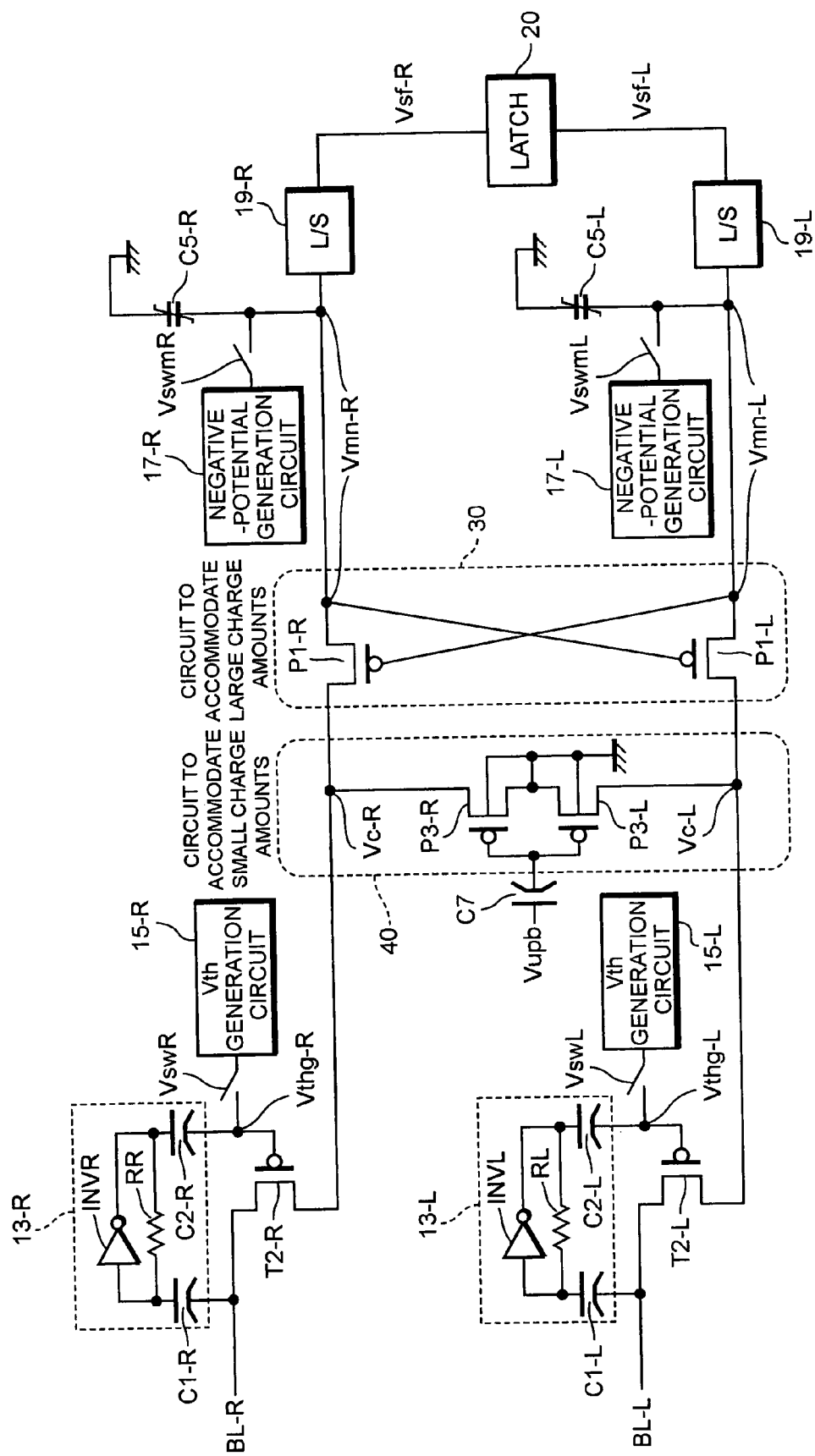
FIG. 7 is a circuit diagram showing the configuration of the sense amplifier (readout circuit) of Embodiment 2.

FIG. 7 is a circuit diagram showing the configuration of a sense amplifier circuit (readout circuit) of this embodiment. To the circuit shown in FIG. 2 is added a circuit 40 as a circuit to accommodate small charge amounts.

That is, the p-channel MISFETs P3-L and P3-R are connected to the third node Vc-L and fourth node Vc-R, which are connection nodes for the p-channel MISFETs T2-L, T2-R and for the p-channel MISFETs P1-L, P1-R.

Specifically, the p-channel MISFET P3-L is connected between the third node Vc-L and ground potential, and the p-channel MISFET P3-R is connected between the fourth node Vc-R and ground potential. The gate electrodes of the p-channel MISFETs P3-L and P3-R are connected via capacitance C7 to the signal line Vupb. And, the back gates of the p-channel MISFETs P3-L and P3-R are connected to ground potential. By means of these connections, leakage currents to the substrate can be reduced. Here, signal lines and signals may be indicated using the same symbols; also, here a paraelectric capacitance was used as capacitance C7, but a ferroelectric capacitance may be used.

Next, readout operation for the above ferroelectric memory device having a sense amplifier circuit is explained. FIG. 8 and FIG. 9 show readout timing charts for the ferroelectric memory device. Details of operation which are the same as in Embodiment 1 are omitted, and the details of operation related to the circuit 40 in particular are explained. FIG. 8A through FIG. 8D are the same waveforms as in FIG. 3A through FIG. 3D.

As explained for the case of Embodiment 1 referring to FIG. 3 and similar, the control signal Vthgen is set to H level (see FIG. 3A and FIG. 8A), and the threshold potential is supplied to the p-channel MISFETs T2-L, T2-R. Then, the potential of the word line WL is set to H level (see FIG. 9, WL). Also, the control signal Vsw is set to L level (see FIG.

Figure 8A:
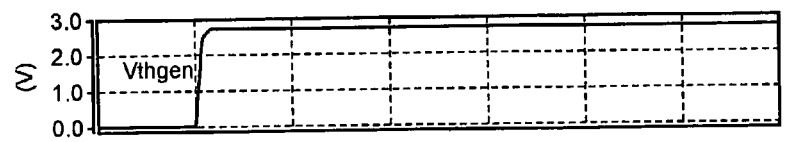
FIG. 8 shows a readout timing chart of a ferroelectric memory device.
Figure 8B:
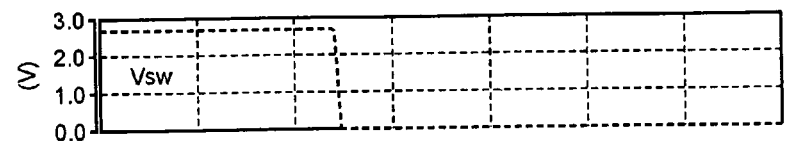
Figure 8C:
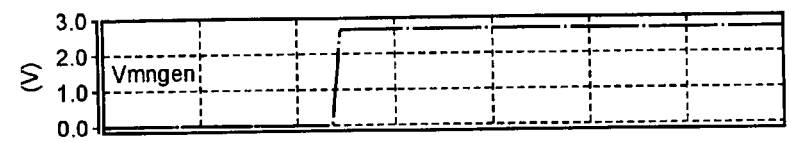
Figure 8D:
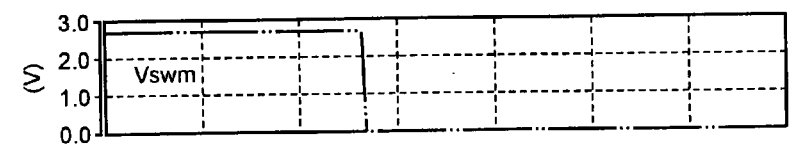
Figure 9:
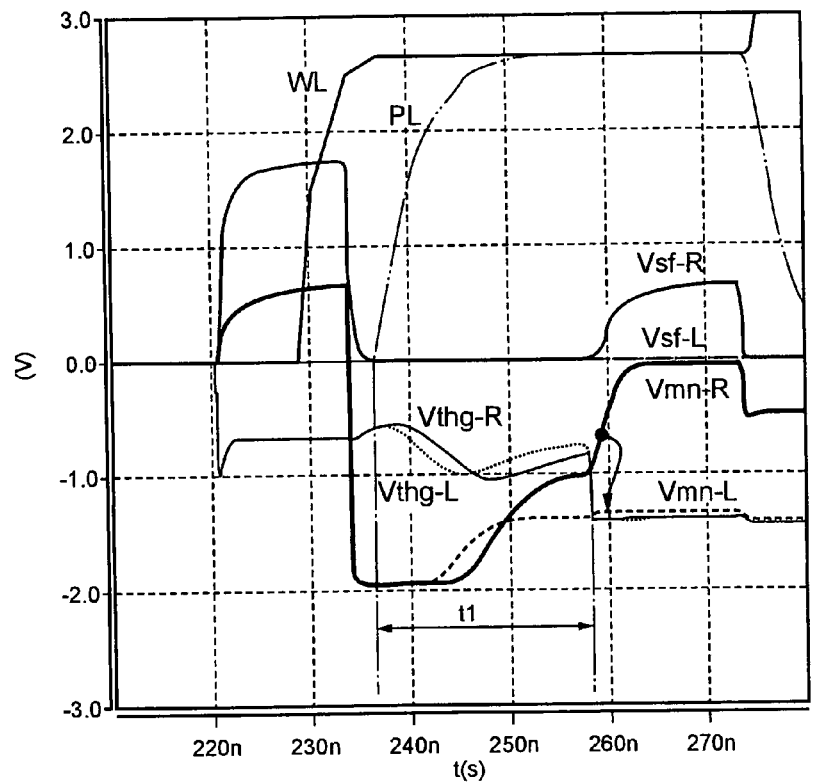
FIG. 9 shows a readout timing chart of a ferroelectric memory device.

3B, FIG. 8B), to put the nodes Vthg-L and Vthg-R into a floating state. Next, the control signal Vmngen is set to H level (see FIG. 3C, FIG. 8C), and tank capacitances C5-L, C5-R are charged with negative charge. Then, the control signal Vswm is set to L level (see FIG. 3D, FIG. 8D), putting the first node Vmn-L and second node Vmn-R into a floating state.

Next, the plate line PL is set to H level (see FIG. 9, PL). As a result, as explained in Embodiment 1, memory cell charge is transferred to bit lines BL-L, BL-R. And, the potential of the first node Vmn-L and second node Vmn-R rises.

As explained above, in this embodiment the p-channel MISFETs P3-L and P3-R (40) are provided, so that the following operation occurs.

Figure 8E:
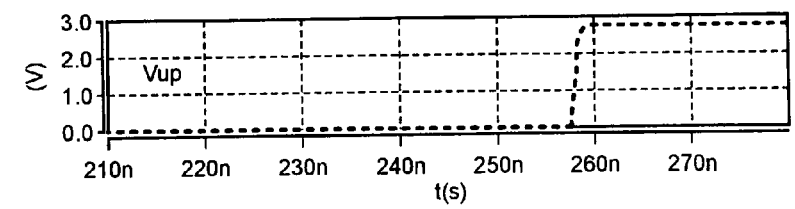

That is, as shown in FIG. 8E, the control signal Vup is held at H level for a fixed interval (for example, for an interval t1 from the rising edge of plate line PL). That is, Vupb, which is the inverted signal of Vup, goes to L level. Hence the signal is transmitted via capacitance C7, and the p-channel MISFETs P3-L and P3-R are put into the on state. As a result the third node Vc-L and fourth node Vc-R, which are at negative potential, are connected with ground potential, and the potential at the first node Vmn-L and second node Vmn-R, which are at negative potential, rises.

Thereafter, as explained in detail in Embodiment 1, the node with higher potential among the first node Vmn-L and second node Vmn-R first reaches the threshold potential of the p-channel MISFETs P1-L and P1-R, and the p-channel MISFET of the other side is turned off. In FIG. 9, the potential of the second node Vmn-R is first raised to the threshold potential (here, −0.7 V), so that the p-channel MISFET P1-L is turned off. As a result, the rising of the potential of the first node Vmn-L stops (see FIG. 9, Vmn-R, Vmn-L).

Thus in this embodiment, even in cases in which, due to the small capacitance of memory cell ferroelectric capacitors, there is little increase in the potential of the first and second nodes Vmn-L and Vmn-R resulting from charge transfer from memory cells, a large potential difference therebetween can be secured. Hence the readout margin can be improved.

Below, advantageous results of this embodiment are explained in further detail, referring to the above-described comparison circuit (FIG. 5).

Figure 10:
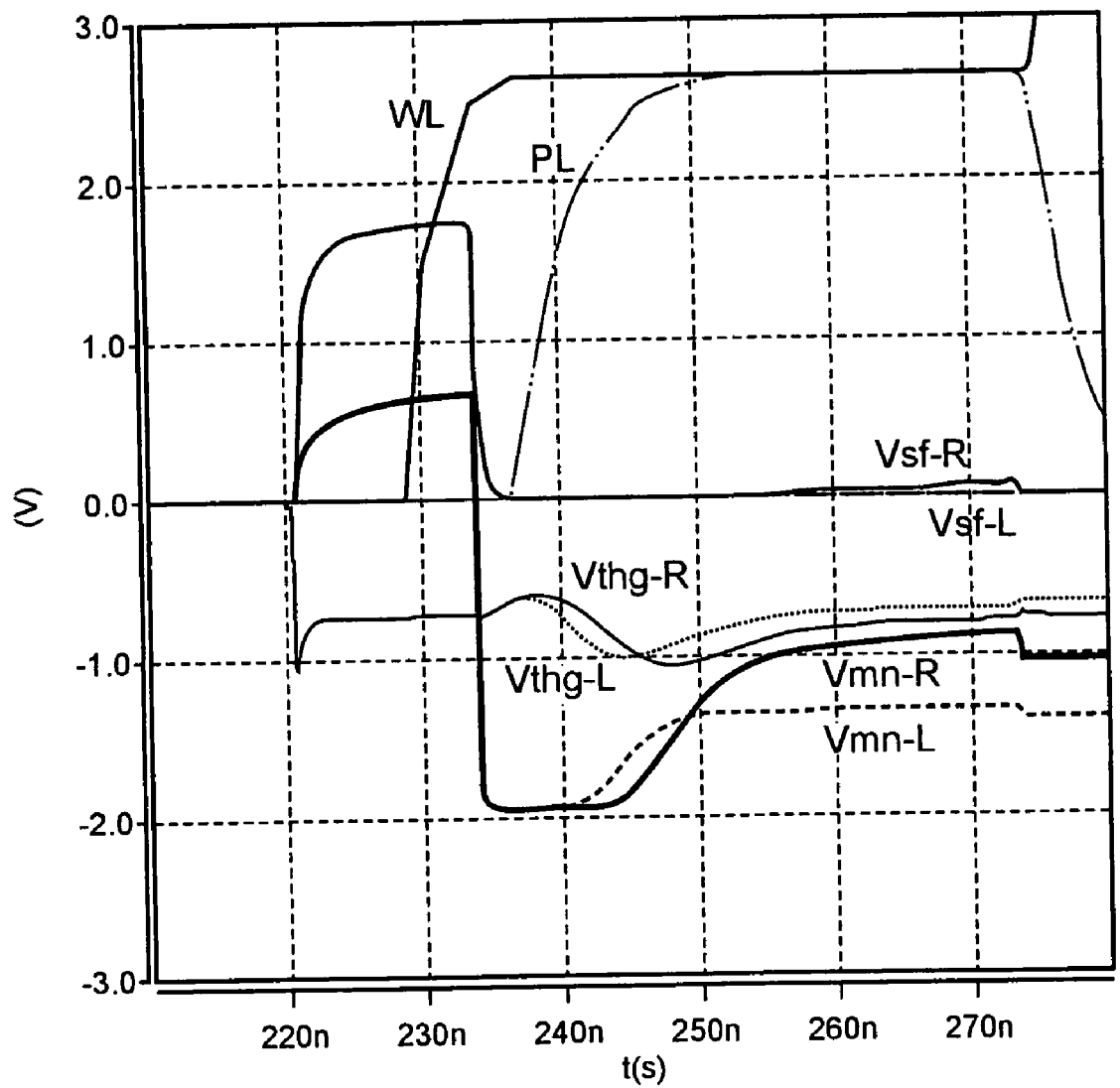
FIG. 10 shows the results of simulations when, in the comparison circuit shown in FIG. 5, the ferroelectric capacitor capacitance of memory cells is small.

FIG. 10 shows simulation results for a case in which, in the comparison circuit shown in FIG. 5, the memory cell ferroelectric capacitor capacitance (data "1" charge amount) is small.

In this case, as shown in FIG. 10, memory cell charge transfer (extraction) ends quickly, and the rise in potential of the second node Vmn-R corresponding to data "1" stops. Hence the potential difference between the first node Vmn-L and the second node Vmn-R is small, and corresponding to this, the potential difference between the outputs Vsf-L and Vsf-R of the positive-potential conversion circuits 19-L, 19-R is also small. In positive-potential conversion, because conversion loss normally occurs, the potential difference becomes smaller still.

As stated above, in this embodiment the potential of the first node Vmn-L and second node Vmn-R can be made to rise to the potential at which the circuit 30 operates by the p-channel MISFETs P3-L and P3-R (40). And, the potential difference between the first node Vmn-L and second node Vmn-R can be made equal to or greater than Vth.

Thus the potential difference between the outputs Vsf-L and Vsf-R of the positive-potential conversion circuits 19-L, 19-R can be made large. Further, a potential difference at least as great as Vth can be secured, so that the potential difference between outputs Vsf-L and Vsf-R can be made large regardless of the settings (conversion loss) of the positive-potential conversion circuits 19-L, 19-R. As a result, the readout margin can be improved. Readout characteristics can also be improved. In FIG. 9 and FIG. 10, changes in the potential of node Vthg-L and Vthg-R are also shown (similarly for FIG. 11).

Of course, in this embodiment the circuit 30 is provided, and so similarly to the detailed explanation of Embodiment 1, cases in which the memory cell ferroelectric capacitor capacitance (data "0" charge amount) is large can also be accommodated.

Figure 11:
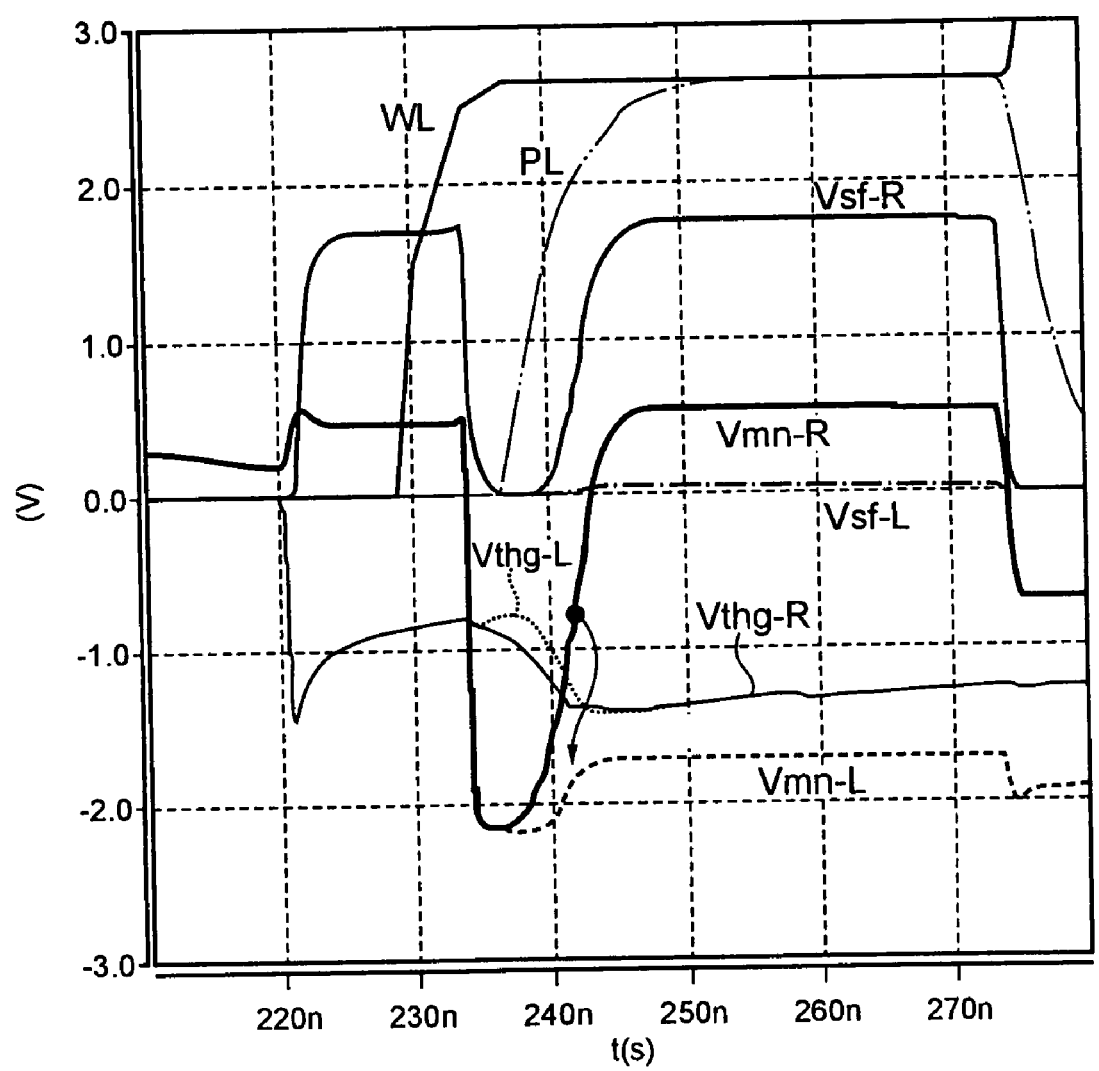
FIG. 11 shows the results of simulations when, in the circuit of FIG. 7, the ferroelectric capacitor capacitance of memory cells is large.

FIG. 11 shows simulation results for a case in which, in the circuit of FIG. 7, the memory cell ferroelectric capacitor capacitance (data "0" charge amount) is large. In this case, prior to the timing at which the control signal Vup goes to H level, circuit 30 operates, and a potential difference can be secured between the first node Vmn-L and the second node Vmn-R. Operation of the circuit 30 is as explained in Embodiment 1. Hence the results of FIG. 11 are similar to the results of FIG. 4.

Thus by means of this embodiment, cases in which the memory cell ferroelectric capacitor capacitance is both large and small can be accommodated.

Further, the tank capacitances C5-L and C5-R can for example be provided as gate capacitances. A gate capacitance is the capacitance formed by a substrate, an insulating film on the substrate, and a conductive film thereupon; the conductive film can be formed using the same material (process) as the gate electrode of a MISFET.

That is, when a tank capacitance is formed from materials different from those of the ferroelectric capacitance of memory cells, the voltage characteristics and temperature characteristics of these capacitances are different, and so it is difficult to execute control such that a prescribed capacitance ratio is obtained in the usage state. However, by means of this embodiment, compensation by the circuits 30 and 40 is possible as described above, even when the capacitance ratio changes. Hence tank capacitances can be formed using gate electrodes. If tank capacitances are formed as gate capacitances, process variance can be reduced compared with ferroelectric capacitances. Of course, conductive film other than gate electrodes (such as wiring or similar) may also be used to form tank capacitances.

Embodiment 3

In this embodiment, another example of configuration of the circuit to accommodate small charge amounts (40) is explained. Portions which are the same as in Embodiments 1 and 2 are assigned the same symbols, and detailed explanations are omitted.

Figure 12:
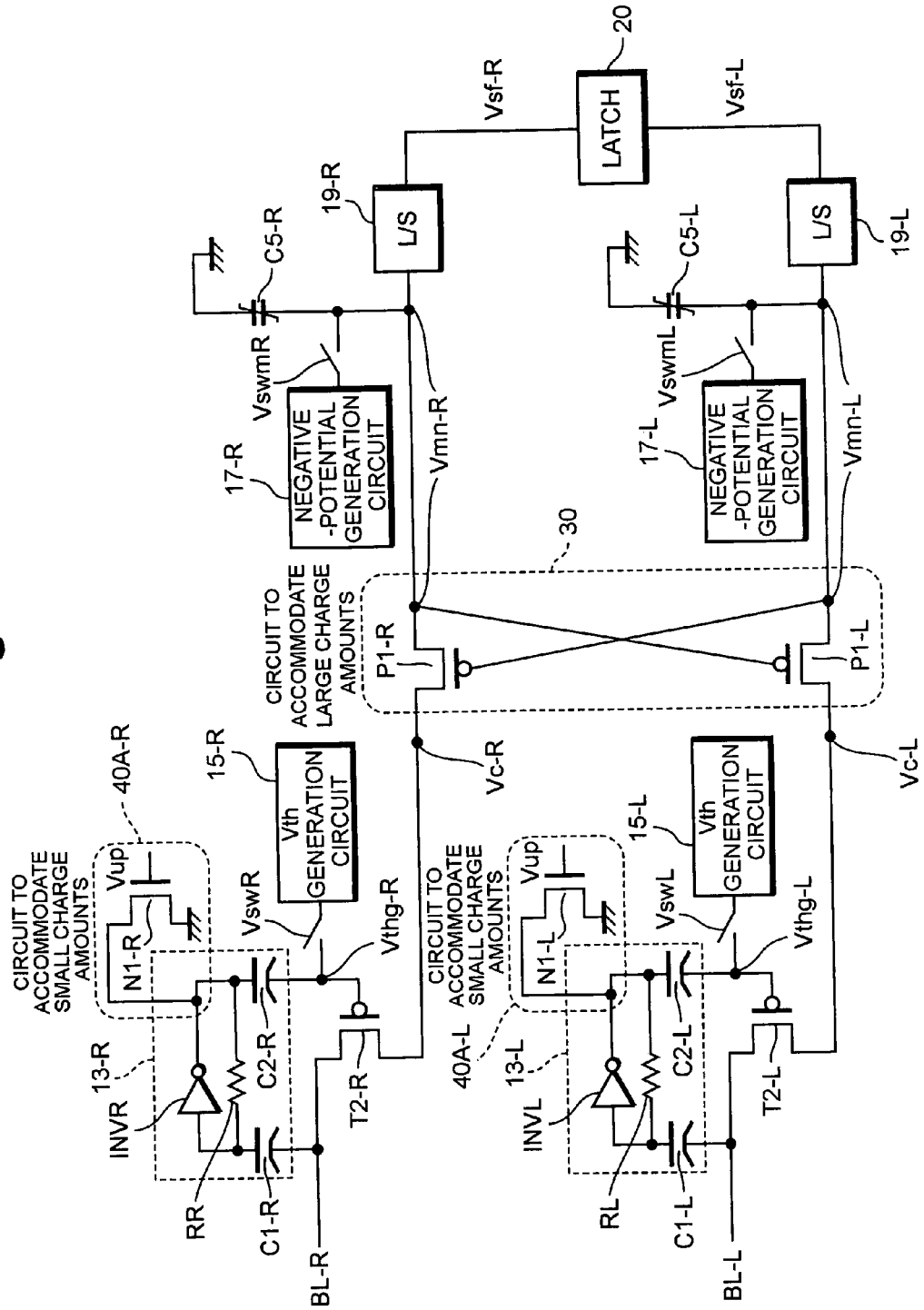
FIG. 12 is a circuit diagram showing the configuration of the sense amplifier (readout circuit) of Embodiment 3.

FIG. 12 is a circuit diagram showing the configuration of the sense amplifier circuit (readout circuit) of this embodiment. To the circuit shown in FIG. 2 are added, as circuits to accommodate small charge amounts, the circuits 40A-L and 40A-R.

That is, an n-channel MISFET N1-L is connected between the output portion of the inverter INVL and ground potential, and an n-channel MISFET N1-R is connected between the output portion of the inverter INVR and ground potential. The gate electrodes of these n-channel MISFETs N1-L, N1-R are connected to the signal line Vup.

Next, readout operation of a ferroelectric memory device having the above sense amplifier circuit is explained. Operation of the various signals and similar are the same as in Embodiment 2 (FIG. 8, FIG. 9). Hence operation of the circuits 40A-L, 40A-R following the change to H level of the control signal Vup is explained.

As shown in FIG. 8E, when the control signal Vup goes to H level after a fixed interval from the start of a readout operation (for example after time t1 from the rising edge of the plate line PL), the n-channel MISFETs N1-L, N1-R enter the on state. Hence the potential of the output portions of the inverters INBL, INBR drops, and corresponding to this, the potential of the nodes Vthg-L, Vthg-R drops. Hence the p-channel MISFETs T2-L, T2-R enter the on state, and the first and second nodes Vmn-L, Vmn-R, which are negative-potential nodes, are connected to the bit lines BL-L, BL-R. As a result, the potential of the first and second nodes vmn-L, Vmn-R rises. That is, charge transfer (extraction) from memory cells ends, and when there is no longer change in the potential of the nodes Vthg-L and Vthg-R, the p-channel MISFETs T2-L, T2-R are turned off. However, here the n-channel MISFETs N1-L, N1-R force the p-channel MISFETs T2-L, T2-R to turn on, and the potential of the first and second nodes Vmn-L, Vmn-R rises.

Thereafter, as explained in Embodiment 2, the node with higher potential among the first node Vmn-L and the second node Vmn-R reaches the threshold value of the p-channel MISFETs P1-L, P1-R more quickly, and the p-channel MISFET on the other side is turned off. In FIG. 9, the potential of the second node Vmn-R is pulled up to the threshold potential (here, −0.7 V) first, and the p-channel MISFET P1-L is turned off. As a result, the rise in potential of the first node Vmn-L stops (see FIG. 9, Vmn-R, Vmn-L).

Thus in this embodiment also, similarly to Embodiment 2, a large potential difference can be secured between the first and second nodes Vmn-L and Vmn-R, even when the memory cell ferroelectric capacitor capacitance is small. Hence the readout margin can be improved. Of course, in this embodiment also, circuit 30 is provided, so that cases of large memory cell ferroelectric capacitor capacitance, such as explained in detail in Embodiment 1, can also be accommodated.

Embodiment 4

In this embodiment, still another example of the configuration of the circuit to accommodate small charge amounts (40) is explained. Portions which are the same as in Embodiments 1, 2 and 3 are assigned the same symbols, and detailed explanations are omitted.

Figure 13:
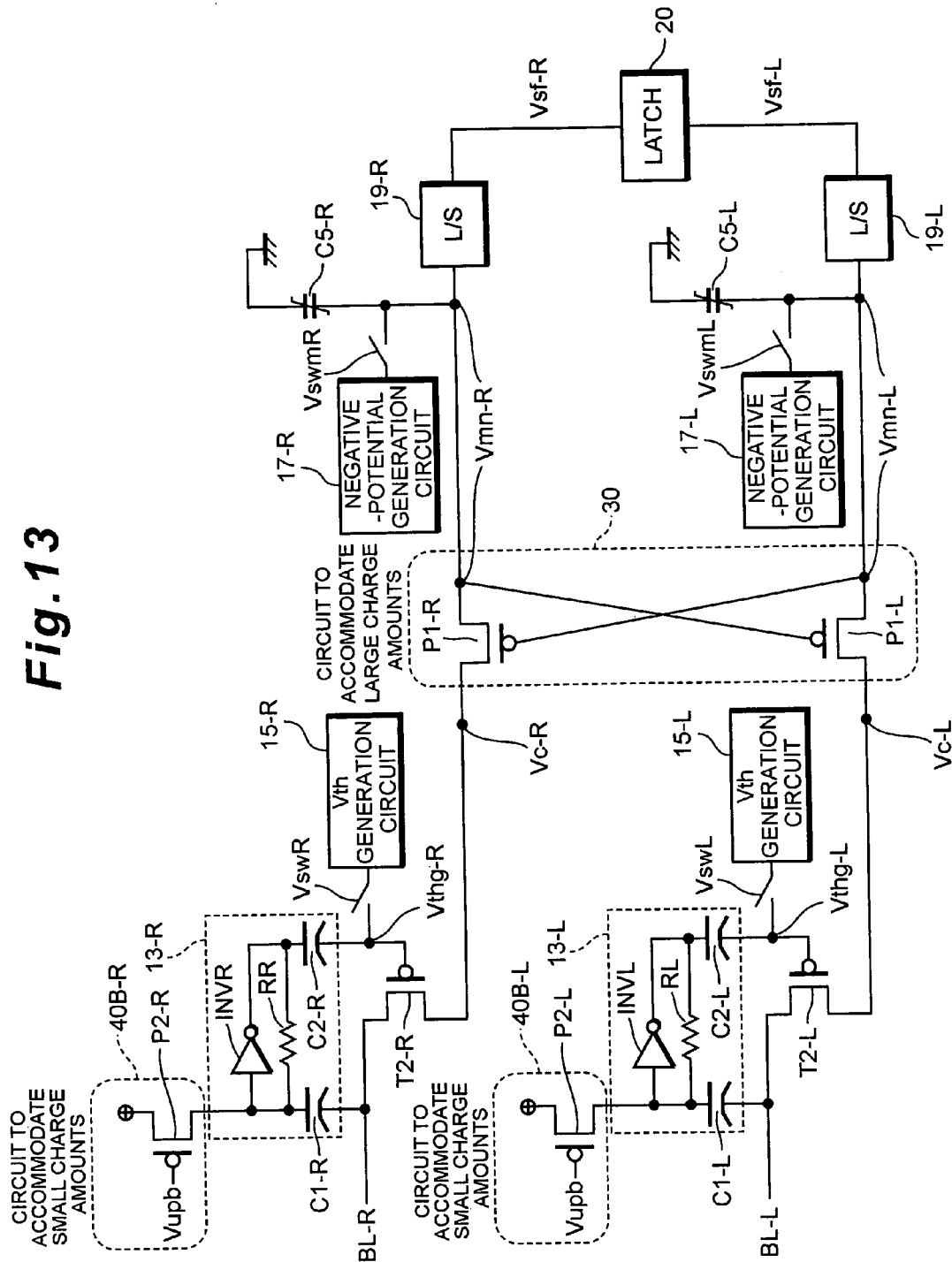
FIG. 13 is a circuit diagram showing the configuration of the sense amplifier (readout circuit) of Embodiment 4.

FIG. 13 is a circuit diagram showing the configuration of the sense amplifier circuit (readout circuit) of this embodiment. To the circuit shown in FIG. 2 are added, as circuits to accommodate small charge amounts, the circuits 40B-L and 40B-R.

That is, a p-channel MISFET P2-L is connected between the input portion of the inverter INVL and the power supply potential (driving potential, Vcc, Vdd), and a p-channel MISFET P2-R is connected between the input portion of the inverter INVR and the power supply potential. The gate electrodes of these p-channel MISFETs P2-L, P2-R are connected to the signal line Vupb.

Next, readout operation of a ferroelectric memory device having the above sense amplifier circuit is explained. Operation of the various signals and similar are the same as in Embodiment 2 (FIG. 8, FIG. 9). Hence here operation of the circuits 40B-L, 40B-R following the change to L level of the control signal Vupb is explained.

As shown in FIG. 8E, when the control signal Vup goes to H level after a fixed interval from the start of a readout operation (for example, after time t1 from the rising edge of plate line PL), Vupb, which is the inverted signal of Vup, goes to L level, and the p-channel MISFETs P2-L, P2-R enter the on state. Hence the potential of the input portions of the inverters INBL, INBR rises, and the potential of the output portions of the inverters INBL, INBR falls. Corresponding to this, the potential at nodes Vthg-L, Vthg-R falls. Hence the p-channel MISFETs T2-L, T2-R enter the on state, and the bit lines BL-L, BL-R are connected to the first and second nodes Vmn-L, Vmn-R, which are negative-potential nodes. As a result, the potential of the first and second nodes Vmn-L, Vmn-R rises. That is, when charge transfer (extraction) from the memory cell ends, and there is no longer a change in the potential of the nodes Vthg-L, Vthg-R, the p-channel MISFETs T2-L, T2-R enter the off state. However, here the p-channel MISFETs P2-L, P2-R forcibly turn on the p-channel MISFETs T2-L, T2-R, and cause the potential at the first and second nodes Vmn-L, Vmn-R to rise.

Thereafter, as explained in Embodiment 2, the node among the first node Vmn-L and second node Vmn-R at the higher potential reaches the threshold potential of the p-channel MISFETs P1-L, P1-R first, and the p-channel MISFET on the other side is turned off. In FIG. 9, the potential of the second node Vmn-R is raised to the threshold potential (here, −0.7 V) first, and the p-channel MISFET P1-L is turned off. As a result, the rise in potential of the first node Vmn-L stops (see FIG. 9, Vmn-R, Vmn-L).

Thus in this embodiment also, similarly to Embodiment 2, even when the memory cell ferroelectric capacitor capacitance is small, a large potential difference can be secured between the first and second nodes Vmn-L and Vmn-R. Hence the readout margin can be improved. Of course, in this embodiment also, the circuit 30 is provided, so that cases in which the memory cell ferroelectric capacitor capacitance is large, described in detail in Embodiment 1, can also be accommodated.

Next, further advantageous results of the circuits to accommodate small charge amounts (40, 40A-L/R, 40B-L/R) explained in Embodiments 2 through 4 are explained.

In the circuit to accommodate small charge amounts 40 of Embodiment 2, by means of the control signal Vupb, the first and second nodes Vmn-L, Vmn-R can be reliably pulled up. And, because this control is separate from the bit lines BL-L and BL-R, noise is not easily imparted to the bit lines BL-L and BL-R.

In the circuits to accommodate small charge amounts 40A-L/R and 40B-L/R of Embodiments 3 and 4, there is no need to form a capacitance C7 to control MISFETs with a positive potential, and the circuit area can be reduced.

Further, in the circuits to accommodate small charge amounts 40B-L/R of Embodiment 4, the potential on the input side of the inverters INVL, INVR is controlled, so that the input/output potentials of the inverters INVL, INVR can be fixed at H level and L level, and through currents can be reduced.

In the above embodiments, examples of 2T2C ferroelectric memory were explained; but this invention can also be applied to 1T1C ferroelectric memory (for example, open-bit type 1T1C memory) in which a reference potential is applied to one bit line.

Embodiment 5

Figure 14:
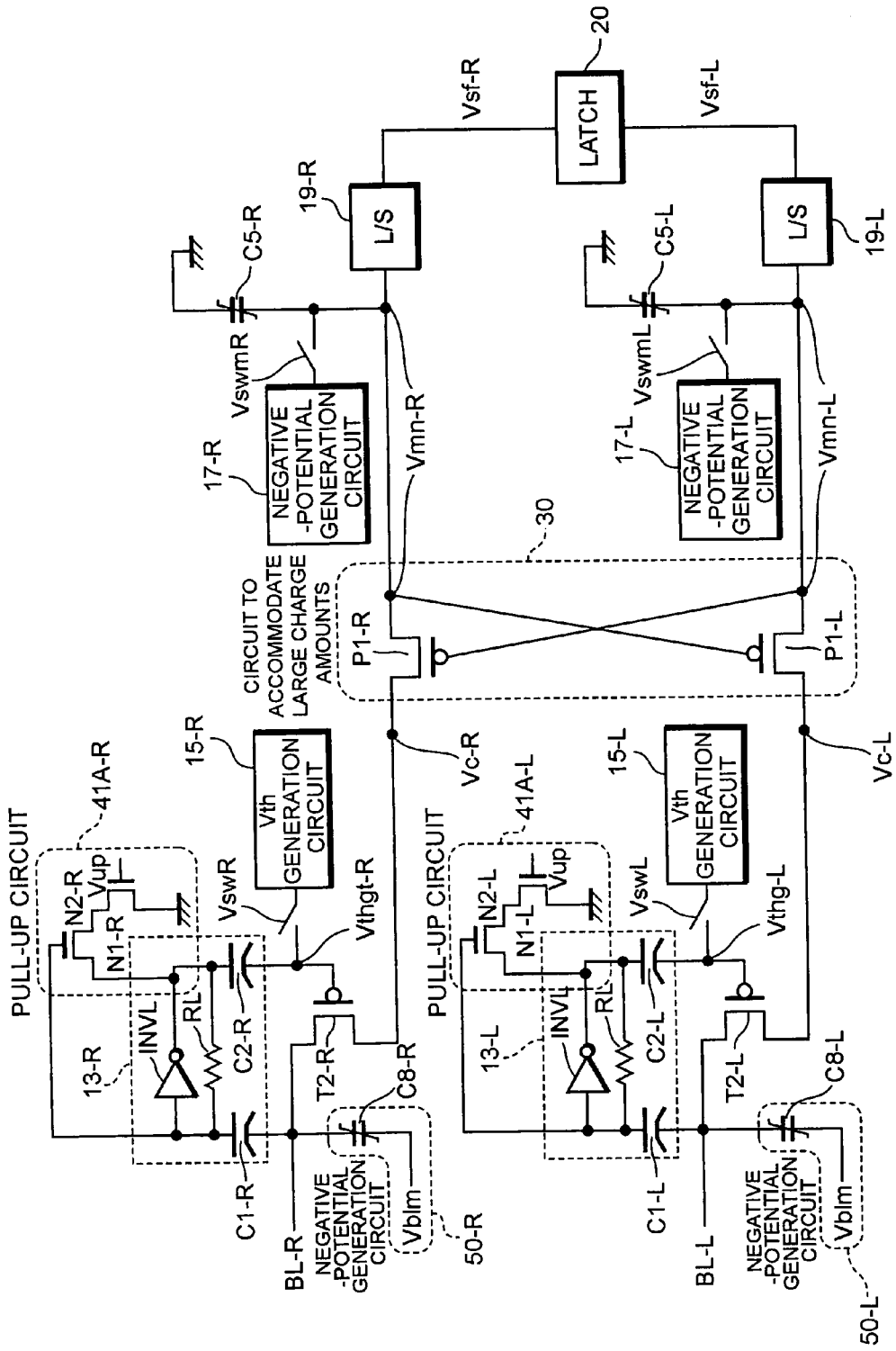
FIG. 14 is a circuit diagram showing the configuration of the sense amplifier (readout circuit) of Embodiment 5.

FIG. 14 is a circuit diagram showing the configuration of the sense amplifier circuit (readout circuit) of this embodiment. In the circuit shown in FIG. 2, negative-potential generation circuits 50-L, 50-R and pull-up circuits (circuits to accommodate small charge amounts) 41A-L, 41A-R are provided. In the following explanation, portions which have the same function as portions in the above Embodiments 1 through 4 are assigned the same or related symbols, and repeated explanations are omitted. Further, in the following explanations, the same symbols may be used for signal lines and for signals (potentials).

The negative-potential generation circuits 50-L, 50-R have capacitances C8-R, C8-L respectively; capacitance C8-R is connected between the bit line BL-R and signal line Vblm, and capacitance C8-L is connected between the bit line BL-L and signal line Vblm. Here, ferroelectric capacitances are used as the capacitances C8-R, C8-L, but paraelectric capacitances may be used.

The pull-up circuits 41A-L, 41A-R each have two n-channel MISFETs (N2-L and N1-L, and N2-R and N1-R). That is, the n-channel MISFETs N2-L and N1-L are connected in series between the output portion of the inverter INVL and ground potential (reference potential, GND, Vss), with the gate electrode of the n-channel MISFET N2-L connected to the input portion of the inverter INVL and the gate electrode of the n-channel MISFET N1-L connected to the signal line Vup. Further, the n-channel MISFETs N2-R and N1-R are connected in series between the output portion of the inverter INVL and ground potential, with the gate electrode of the n-channel MISFET N2-R connected to the input portion of the inverter INVR, and the gate electrode of the n-channel MISFET N1-R connected to the signal line Vup.

Otherwise the configuration is similar to that of Embodiment 1 (FIG. 2). As a brief explanation, the bit lines BL-L and BL-R are connected to the first node Vmn-L and second node Vmn-R via the two p-channel MISFETs T2-L and P1-L and the two p-channel MISFETs T2-R and P1-R, respectively. The connection node between the p-channel MISFETs T2-L and P1-L is Vc-L, and the connection node between the p-channel MISFETs T2-R and P1-R is Vc-R.

On the other hand, tank capacitances C5-L and C5-R are connected between the first node Vmn-L and second node Vmn-R respectively and ground potential.

Further, negative-potential generation circuits 17-L, 17-R are connected via the switching transistors VswmL and VswmR to the first node Vmn-L and second node Vmn-R respectively.

Further, positive-potential conversion circuits (L/S) 19-L, 19-R are connected to the first node Vmn-L and second node Vmn-R, and the potential difference between these outputs (signals) Vsf-L, Vsf-R is judged by a latch circuit 20 to perform readout.

Also, threshold potential (Vth) generation circuits 15-L, 15-R are connected, via switching transistors VswL, VswR, to the gate electrodes (nodes Vthg-L, Vthg-R) of the p-channel MISFETs T2-L, T2-R respectively.

Further, inverter amplifier circuits (control circuits, feedback circuits) 13-L, 13-R are connected between the bit lines BL-L, BL-R and the gate electrodes of the p-channel MISFETs T2-L, T2-R, respectively. The inverter amplifier circuits 13-L, 13-R are formed from inverters INVL, INVR, capacitances C1-L, C1-R, C2-L, C2-R, and resistances RL, RR. These resistances RL, RR may be switching transistors.

Specifically, the bit line BL-L and input portion of the inverter INVL are connected via capacitance C1-L, and the gate electrode of the p-channel MISFET T2-L and output portion of the inverter INVL are connected via capacitance C2-L. Also, the input portion and output portion of the inverter INVL are connected via resistance RL.

Similarly, the bit line BL-R and input portion of the inverter INVR are connected via capacitance C1-R, and the gate electrode of the p-channel MISFET T2-R and output portion of the inverter INVR are connected via capacitance C2-R. Also, the input portion and output portion of the inverter INVR are connected via resistance RR.

Also, the gate electrode of the p-channel MISFET P1-L is connected to the second node Vmn-R, and the gate electrode of the p-channel MISFET P1-R is connected to the first node Vmn-L. These cross-connected p-channel MISFETs P1-L and P1-R form circuit 30 (a circuit to accommodate large charge amounts).

Next, readout operation of a ferroelectric memory device having the above sense amplifier circuit is explained. FIG. 15 and FIG. 16 show readout timing charts of the ferroelectric memory device of this embodiment. The horizontal axis indicates time (ns), and the vertical axis indicates potential (V).

Figure 15A:
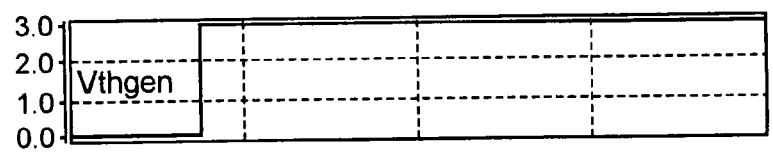
FIG. 15 is a readout timing chart of the ferroelectric memory device of Embodiment 5.

As shown in FIG. 15A, the control signal Vthgen of the threshold potential generation circuits 15-L, 15-R is set to H level (high potential level), and threshold potentials for the p-channel MISFETs T2-L, T2-R are output from the threshold potential generation circuits 15-L, 15-R. At this time, the control signal Vsw common to the switching transistors VswL, VswR is at H level, and the switching transistors VswL, VswR are in the on (conducting) state (see FIG. 15B). Hence the threshold potentials are supplied to the gate electrodes of the p-channel MISFETs T2-L, T2-R.

Figure 15B:
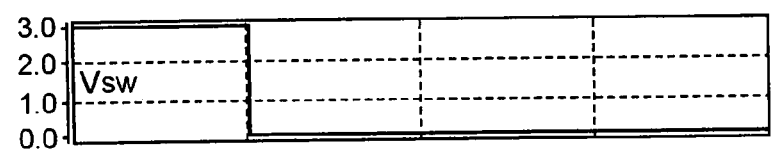
Figure 15C:
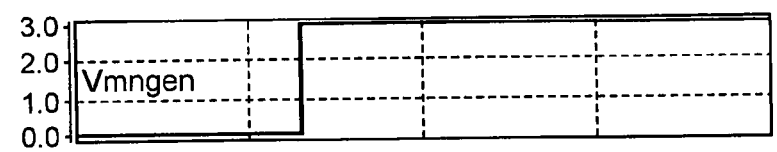
Figure 16:
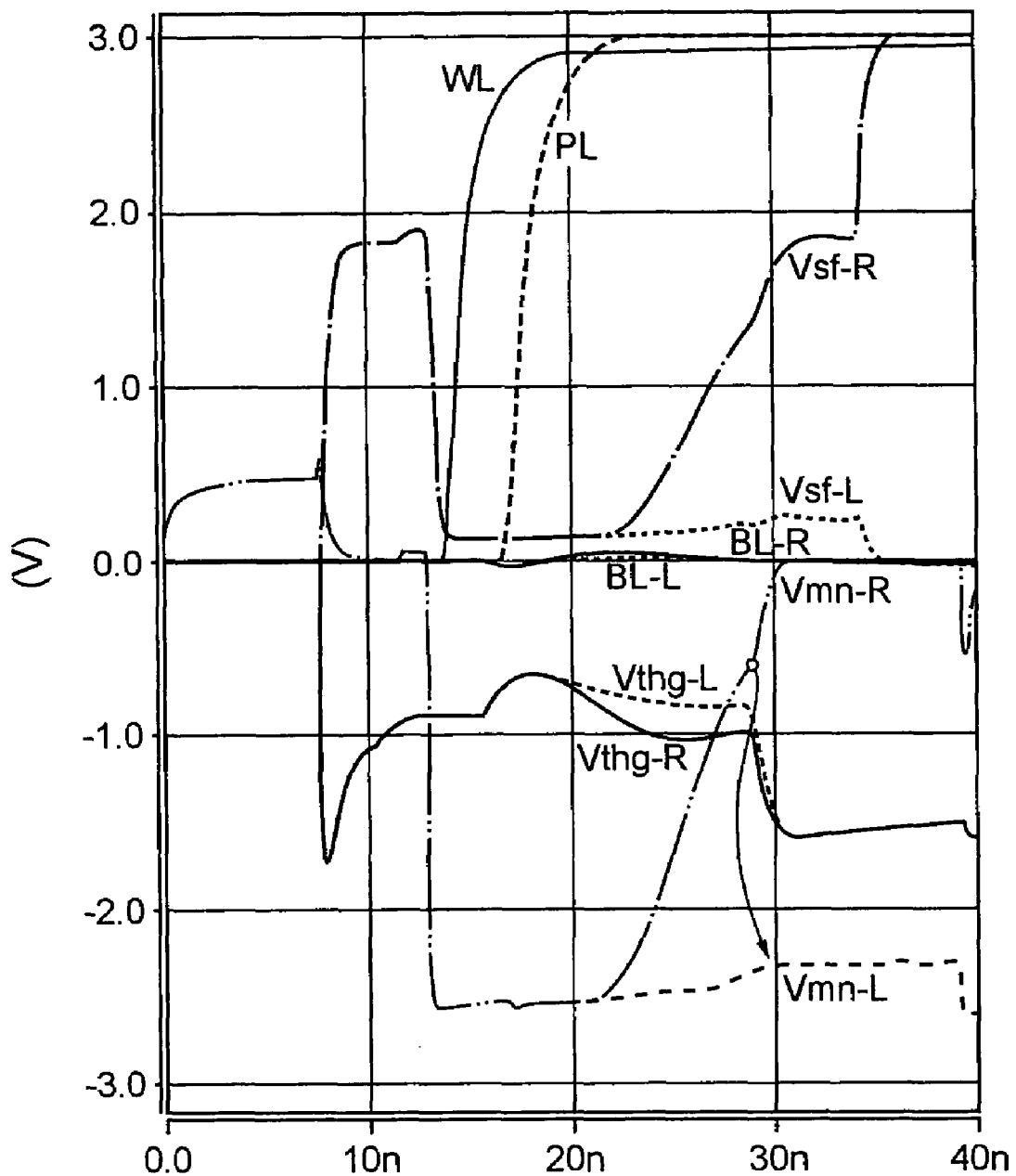
FIG. 16 is a readout timing chart of the ferroelectric memory device of Embodiment 5.

Next, the control signal Vsw is set to L level (low potential level), and the switching transistors VswL, VswR are put into the off state (see FIG. 15B). By this means, the nodes Vthg-L, Vthg-R enter a floating state.

Next, the potential of the word line WL is set to H level (see FIG. 16, WL). Then, the control signal Vmngen of the negative-potential generation circuits 17-L, 17-R is set to H level, so that a negative potential is output from the negative-potential generation circuits 17-L, 17-R (see FIG. 15C). At this time, the control signal Vswm common to the switching transistors VswmR, VswmL is at H level, and the switching transistors VswmR, VswmL are in the on state (see FIG. 15D). Hence the first node Vmn-L and second node Vmn-R are at negative potential. In other words, the tank capacitances C5-L, C5-R are charged with negative charge.

Next, signal Vblm is charged from H level to L level (see FIG. 15E), causing the potential of the bit lines BL-L, BL-R to fall. That is, the potential of the bit lines BL-L, BL-R is sharply dropped from ground potential to a negative potential. For example, near 15 ns in FIG. 16, the potential of the bit lines BL-L, BL-R can be seen to fall from near 0 V somewhat to a negative potential. The drop in the signal Vblm (change from H level to L level) need only be near the rising edge of the plate line PL (start of readout), and is not limited to the timing of the rising edge.

Corresponding to this change in potential of the bit lines BL-L, BL-R, the potential of the nodes Vthg-L and Vthg-R rises. That is, corresponding to the fall in potential of the bit lines BL-L, BL-R, the potential of the input portions of the inverters INVL, INVR drops, and the potential of the output portions rises. Hence the potential of the nodes Vthg-L and Vthg-R rises.

Figure 15D:
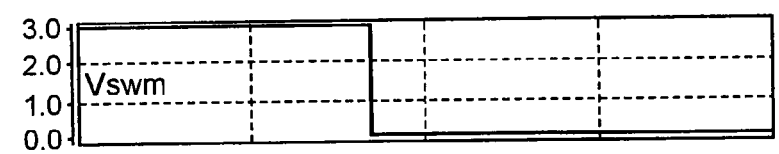
Figure 15E:
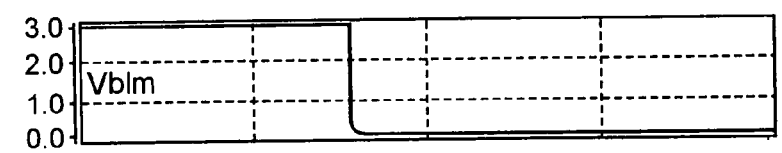

Next, the control signal Vswm is set to L level, and the switching transistors VswmR, VswmL are set to the off state (see FIG. 15D). By this means, the first node Vmn-L and second node Vmn-R enter a floating state.

Next, the plate line PL is set to H level (see FIG. 16, PL). As a result, memory cell charge is read out. In other words, the memory cell charge is transferred to the bit lines BL-L, BL-R.

Due to the above charge transfer, the potential of the bit lines BL-L, BL-R rises. This rise in potential is amplified in inverse phase by the inverter amplifiers 13-L, 13-R, causing a drop in the potential of the nodes Vthg-L, Vthg-R. The amount of potential change (drop amount) depends on the amount of change (rise amount) of the potential of the bit lines, that is, depends on the difference in charge amounts for the memory cell data "0" and data "1".

Here, when the potential of the nodes Vthg-L, Vthg-R falls, the p-channel MISFETs T2-L, T2-R are turned on. As a result, charge is transferred from the bit lines BL-L, BL-R to the tank capacitors C5-L, C5-R charged at negative potential. That is, the potential of the first node Vmn-L and second node Vmn-R rises. When all the memory cell charge is transferred to the tank capacitances C5-L, C5-R, the potential of the bit lines BL-L, BL-R falls, the potential of the nodes Vthg-L, Vthg-R rises, and the p-channel MISFETs T2-L, T2-R are turned off. Hence the rise in potential of the first node Vmn-L and second node Vmn-R stops. At this time, the change in potential of the nodes Vthg-L, Vthg-R differs according to the charge amounts for memory cell data "0" and data "1", and corresponding to this, the amounts of increase in the potential of the first node Vmn-L and second node Vmn-R differ. That is, due to the difference in charge amounts for data "0" and data "1", a potential difference occurs between the first node Vmn-L and second node Vmn-R.

Advantageous Results of Circuit to Accommodate Large Charge Amounts

In this embodiment, as explained in detail in Embodiment 1, cross-connected p-channel MISFETs P1-L, P1-R (30) are provided in the sense amplifier circuit, so that the following action is performed.

That is, among the first node Vmn-L and second node Vmn-R, the node at higher potential first reaches the threshold potential (Vth) of the p-channel MISFETs P1-L, P1-R, and the p-channel MISFET on the other side is turned off. In FIG. 16, the second node Vmn-R first reaches the threshold potential (here, −0.7 V), so that the p-channel MISFET P1-L is turned off. As a result, the rise in potential of the first node Vmn-L stops (see FIG. 16, Vmn-R, Vmn-L).

In this way, an increase in the potential of one among the first node Vmn-L and second node Vmn-R is suppressed, regardless of the potentials of the nodes Vthg-L, Vthg-R, so that a large potential difference therebetween can be secured. Hence the readout margin can be improved.

First Advantageous Result of Pull-up Circuit

Figure 15F:
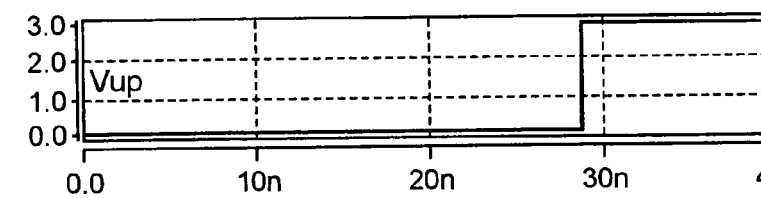

Next, as shown in FIG. 15F, after a fixed period (for example, after an interval t2 from the falling edge of the signal Vblm), the control signal Vup is set to H level. Hence the n-channel MISFETs N1-L, N1-R are put into the on state. Here, a voltage of approximately (½)Vcc is applied from the start to the gate electrode of the n-channel MISFET N2-L or N2-R. This is due to the face that the input and output portions of the inverters (INVL, INVR) are connected via a resistance RR. Hence the n-channel MISFETs N2-L and N2-R are to some degree in the on state from the start, and the extent of the on state (the turn-on current) increases according to the rise in potential of the bit lines BL-L, BL-R (the potential at the input portions of the inverters INVL, INVR).

By turning on the n-channel MISFETs N1-L, N1-R at the rising edge of the control signal Vup, the potential of the nodes Vthg-L, Vthg-R drops. The extent of this potential drop changes according to the difference in potentials of BL-L and BL-R. Hence the p-channel MISFETs T2-L, T2-R enter the on state, and the potential of the first and second nodes Vmn-L, Vmn-R can be made to increase.

Thereafter, as explained above, the node at the higher potential among the first node Vmn-L and second node Vmn-R first reaches the threshold potential of the p-channel MISFETs P1-L and P1-R, and the p-channel MISFET of the other side is turned off.

In this way, by means of the pull-up circuits 41A-R and 41A-L, the potential of the first node Vmn-L and second node Vmn-R can be raised to the potential at which the circuit 30 operates (see Embodiments 2 through 4).

Further, in this embodiment, the degree of the on state (the turn-on current) of the n-channel MISFETs N2-L and N2-R differs according to the potentials of the bit lines BL-L, BL-R. Hence the potential of the nodes Vthg-L, Vthg-R can be dropped while reflecting the difference in potential between the bit lines BL-L, BL-R (see FIG. 16, vicinity of 27 to 30 ns). That is, the potential of the first node Vmn-L and second node Vmn-R can be raised while reflecting the potential difference between the bit lines BL-L, BL-R. Hence the readout margin can be further improved.

Then, readout is performed by using the latch circuit 20 to judge the potential difference between the output (signals) Vsf-L, Vsf-R of the positive-potential conversion circuits (L/S) 19-L, 19-R connected to the first node Vmn-L and second node Vmn-R respectively.

Advantageous Results of Negative-potential Generation Circuit

Further, in this embodiment, negative-potential generation circuits 50-L and 50-R are provided, so that the readout precision can be improved (erroneous judgments can be reduced).

For example, in memory cell readout, the charge amount read out is greater for data "1" than for data "0". However, when degradation unique to ferroelectric characteristics occurs, or when area differences in ferroelectric capacitances occur due to manufacturing variance, the potential may temporarily be higher on the data "0" side than that on the data "1" side. In such cases, the charge output order is set to be reversed.

Figure 17:
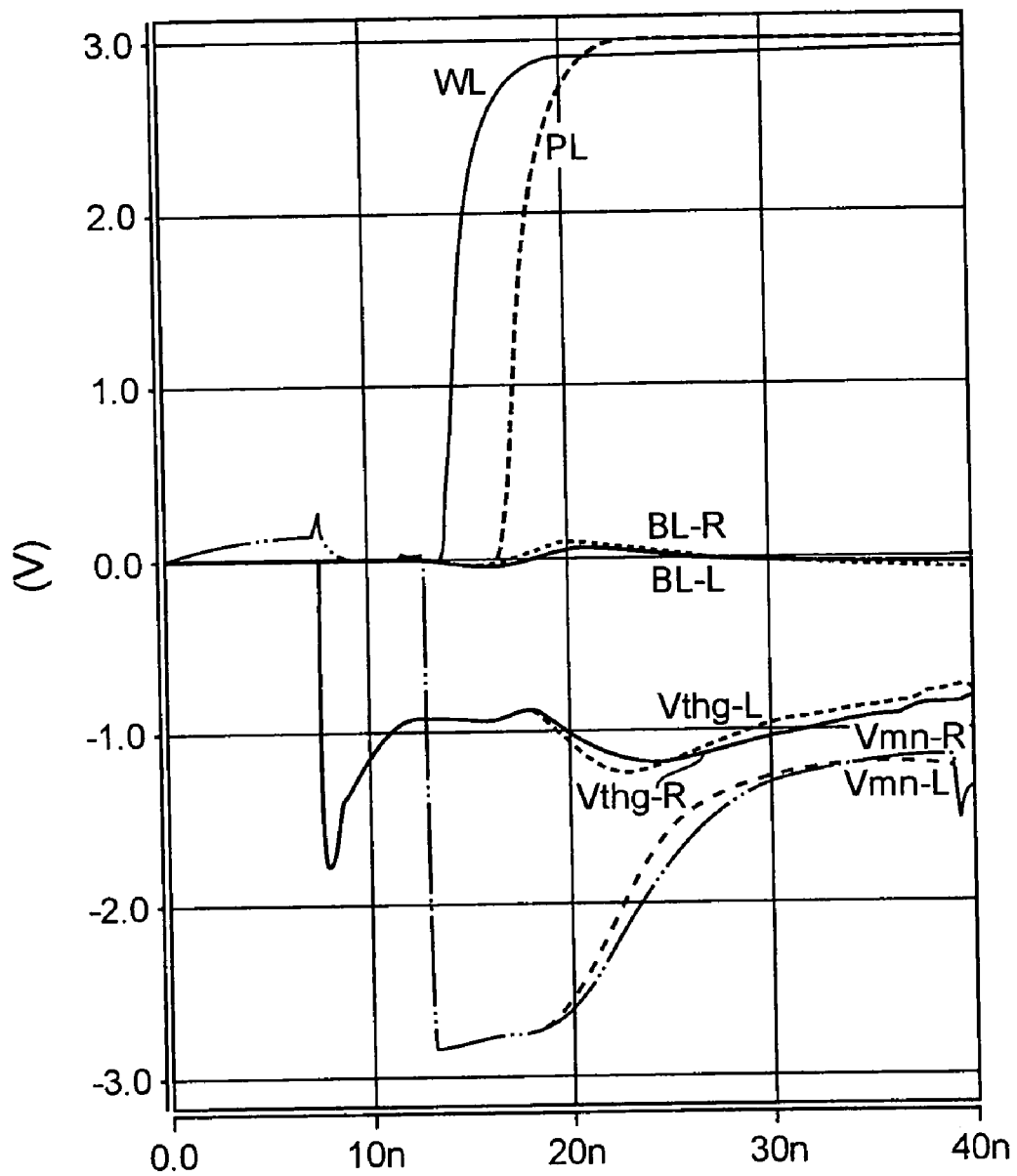
FIG. 17 is a timing chart for a case in which, in the comparison circuit of FIG. 5, the charge output order is reversed.

FIG. 17 is a timing chart for a case in which, in the comparison circuit (FIG. 5), the charge output order is reversed. As shown in the figure, the potential of bit line BL-L (dashed line) is higher than the potential on bit line BL-R (see for example the area near 20 ns). Accompanying this, Vthg-L<Vthg-R, and Vmn-L>Vmn-R. However, ultimately the potential of bit line BL-R is higher than the potential of bit line BL-L, and Vmn-L<Vmn-R.

Figure 18:
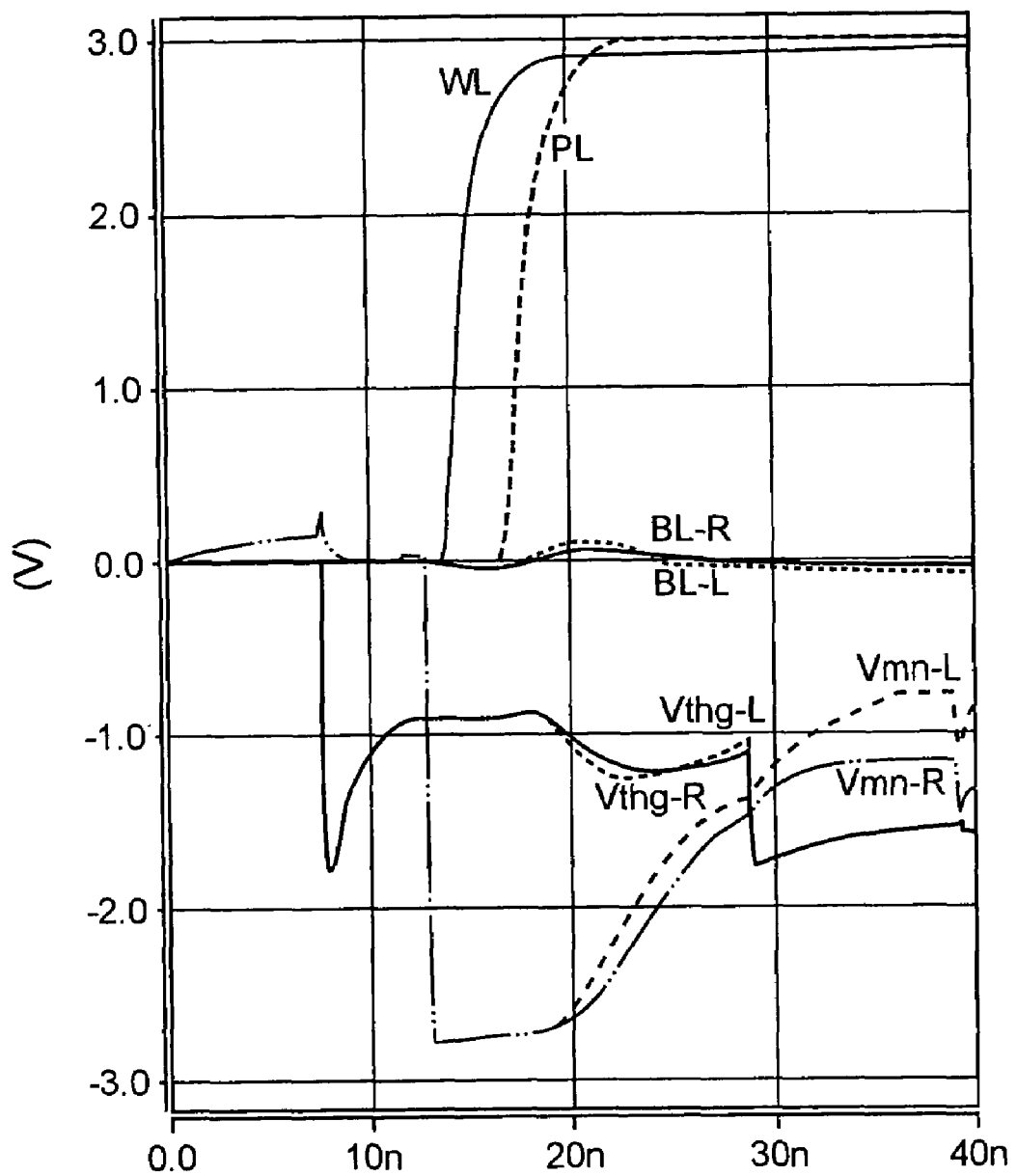
FIG. 18 is a timing chart for a case in which, in the circuit shown in FIG. 12, the charge output order is reversed.

FIG. 18 is a timing chart for a case, in the circuit shown in FIG. 12, in which the charge output order is reversed. As shown in the figure, the potential of bit line BL-L (dashed line) is higher than the potential of bit line BL-R (see for example the area near 20 ns). Accompanying this, Vthg-L<Vthg-R, and readout associated with Vmn-L >Vmn-R (erroneous judgment) is performed.

Figure 19:
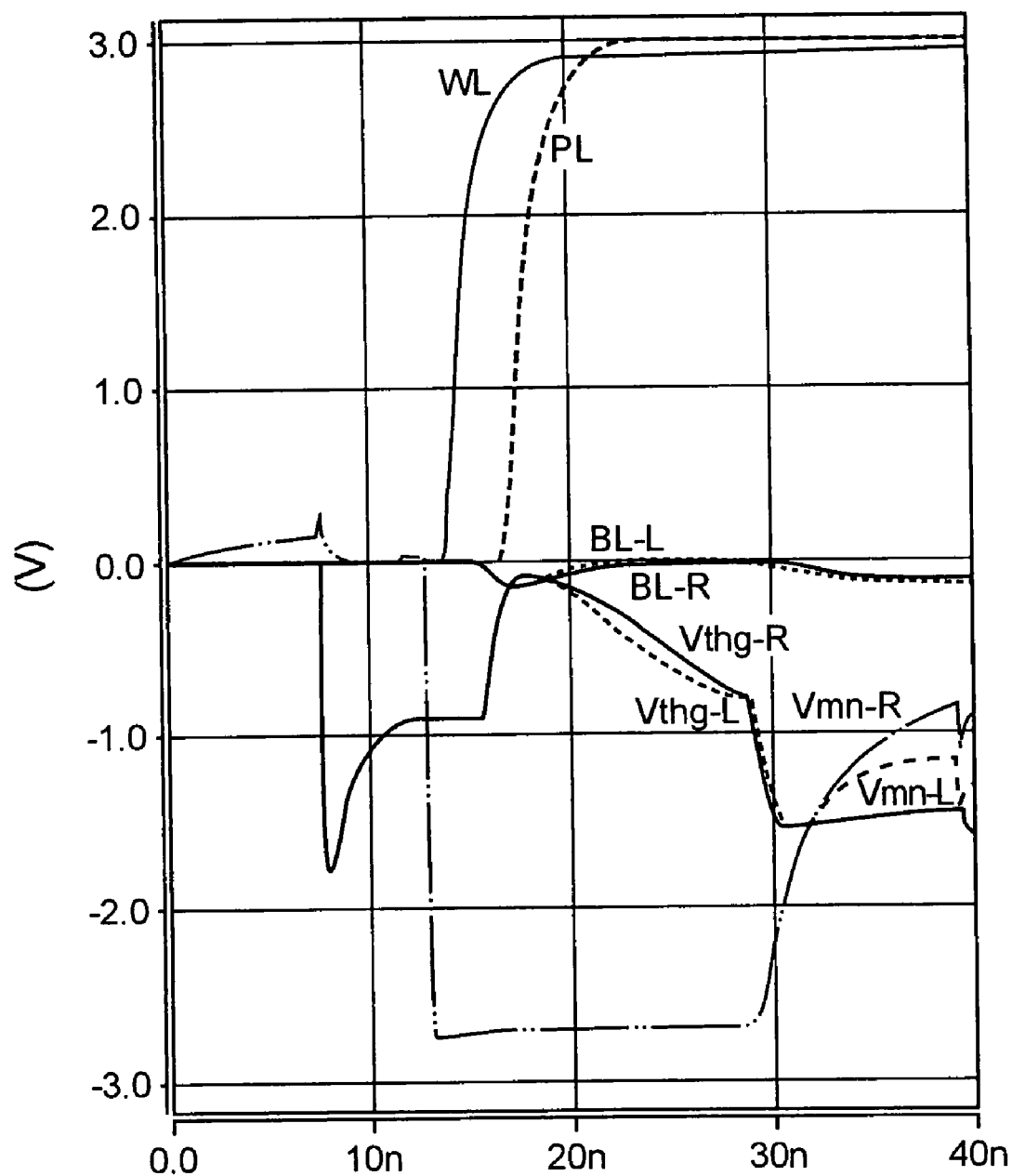
FIG. 19 is a timing chart for a case in which, in the circuit shown in FIG. 14, the charge output order is reversed.

FIG. 19 is a timing chart for a case, in the circuit of this embodiment (FIG. 14), in which the charge output order is reversed. As shown in the figure, initially the potential of bit line BL-L (dashed line) is higher than the potential of bit line BL-R (see for example the area near 20 ns); however, after this relation is corrected, the potential of the nodes Vmn-L and Vmn-R begins to rise, and ultimately judgment is performed based on Vmn-L<Vmn-R. That is, the erroneous judgment is rectified. Further, the potential difference between the nodes Vmn-L and Vmn-R is larger than in the case of FIG. 17. That is, the readout margin is improved.

The above rectification of erroneous judgments is an advantageous result of the negative-potential generation circuits 50-L, 50-R. That is, by means of the negative-potential generation circuits 50-L, 50-R, the potential of the bit lines BL-L, BL-R is dropped sharply to a negative potential, causing the potential of the nodes Vthg-L and Vthg-R to rise, so that operation of the first and second p-channel MISFETs in the initial readout period can be limited. That is, the timing with which the p-channel MISFETs T2-L and T2-R are turned on can be delayed. In other words, operation of the first and second p-channel MISFETs can be masked, so that potentials have no effect, in the initial readout period.

Hence even if the charge output order is temporarily reversed, this relation is corrected by the time the p-channel MISFETs T2-L and T2-R are turned on.

Therefore, after the potential on the data "1" side has risen above the potential on the data "0" side, the p-channel MISFETs T2-L and T2-R are turned on, and raising of the potential of the nodes Vmn-L and Vmn-R can be begun (see FIG. 19, vicinity of 30 ns).

Moreover, after the potential on the data "1" side has risen above the potential on the data "0" side, by raising the signal Vup, the potential of nodes Vthg-L and Vthg-R can be forcibly lowered. Hence the potential of the first or the second node Vmn-L or Vmn-R can be more promptly raised to the potential at which the circuit 30 operates.

It is preferable that the capacitances C8-L, C8-R of the negative-potential generation circuits 50-L, 50-R be made substantially the same as the capacitances of the ferroelectric capacitances in the ferroelectric memory. "Substantially the same" means, for example, formed from the same material and to the same design dimensions. By means of such a configuration, when data "0" charge is canceled and a bit line rises to a positive potential, reversal of the data "0" potential and the data "1" potential is corrected.

In the circuit of the above FIG. 12 also, by for example adjusting the tank capacitances C5-L and C5-R, measures can be taken to ensure that a potential difference does not occur between nodes Vthg-L and Vthg-R in the initial readout period, so that the advantageous results explained in Embodiment 3 can be obtained, while preventing erroneous judgments.

Second Advantageous Result of Pull-up Circuits

Further, in this embodiment the bit lines BL-L, BL-R are sharply dropped to negative potential, so that it is desirable that pull-up circuits 41A-L, 41A-R also be provided.

That is, in this embodiment, there are cases in which the amount of charge read out to nodes Vmn-R, Vmn-L via the bit lines BL-L, BL-R is small. For example, there may be different degrees of degradation of the memory cell ferroelectric capacitances and of the capacitances C8-L, C8-R in the negative-potential generation circuits, so that the bit line potential is dropped too sharply to a negative potential.

Figure 20:
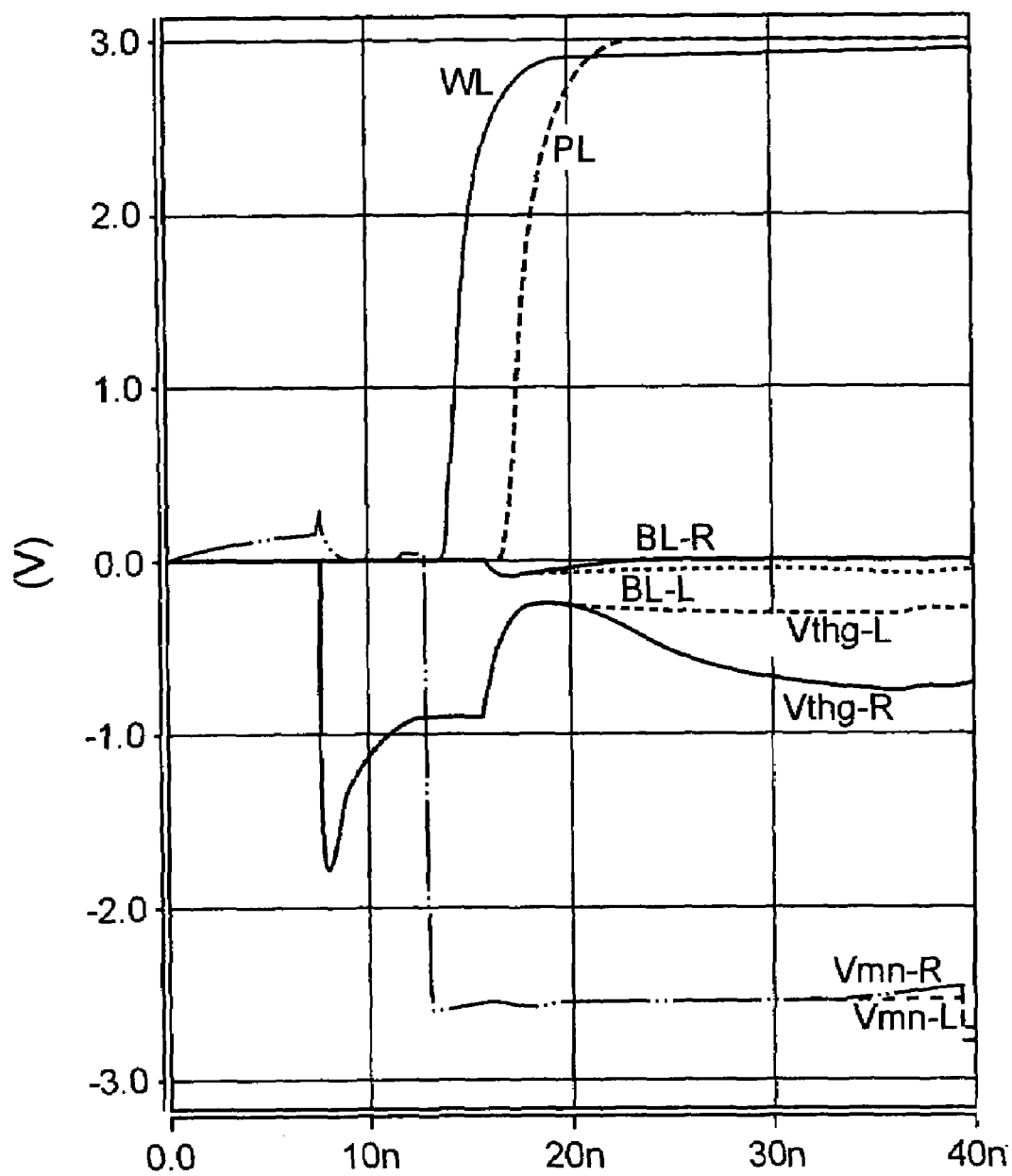
FIG. 20 is a timing chart for a case in which, in the circuit shown in FIG. 14 with the pull-up circuit removed, the bit line potential is dropped too sharply to a negative potential.

FIG. 20 is a timing chart for a circuit obtained by removing the pull-up circuits from the circuit of FIG. 14, in which the bit line potential is dropped too sharply to negative potential. That is, in FIG. 20, compared with FIG. 16, the change to negative potential of the bit lines BL-L and BL-R is greater. In such a case, as shown in the figure, there is little rise in the potential of the node Vmn-R corresponding to data "1", and moreover the potential difference between the nodes Vmn-L and Vmn-R is small. As a result the readout margin is small.

Figure 21:
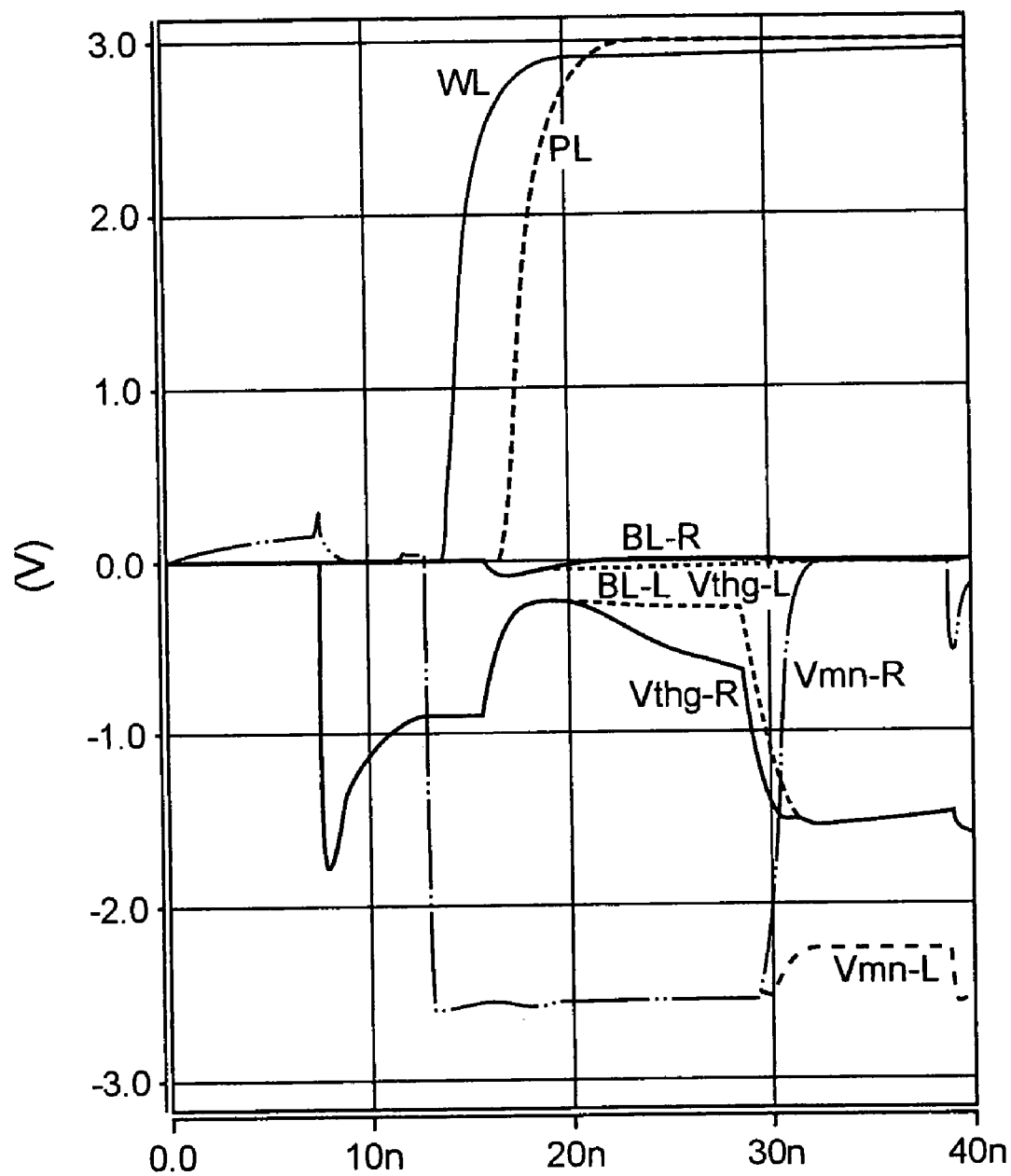
FIG. 21 is a timing chart for a case in which, in the circuit shown in FIG. 14, the bit line potential is dropped too sharply to a negative potential.

FIG. 21 is a timing chart for the circuit of this embodiment (FIG. 14), when the bit line potential is dropped too sharply to a negative potential. In this case also, as explained in the section above on the "advantageous result of pull-up circuits", the potential of the first node Vmn-L and second node Vmn-R can be raised by the pull-up circuits 41A-R, 41A-L to the potential at which the circuit 30 operates, and the readout margin can be improved.

Embodiment 6

Figure 22:
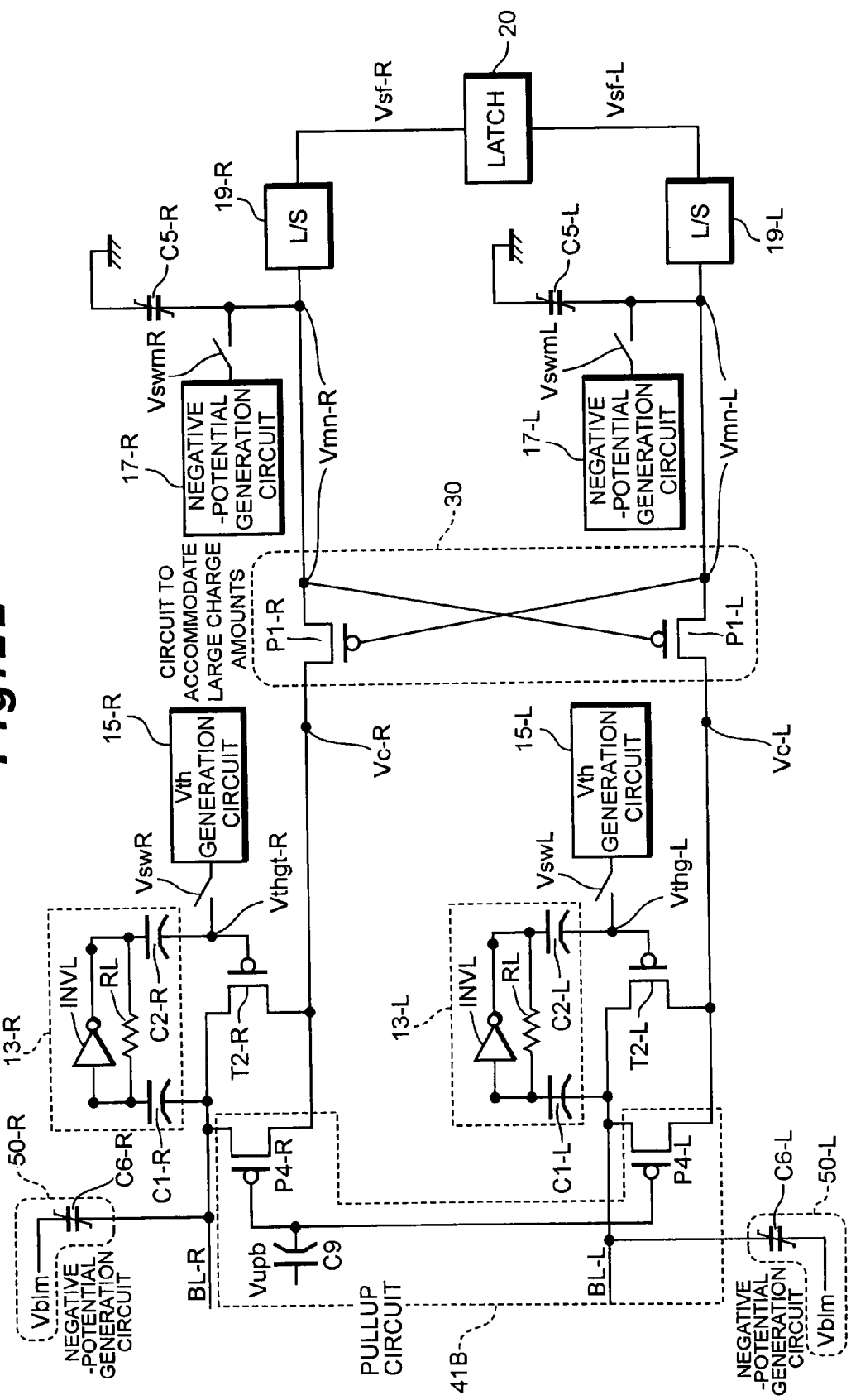
FIG. 22 is a circuit diagram showing the configuration of the sense amplifier (readout circuit) of Embodiment 6.

FIG. 22 is a circuit diagram showing the configuration of the sense amplifier circuit (readout circuit) of this embodiment. Instead of the pull-up circuits 41A-L, 41A-R of FIG. 14 (Embodiment 5), the pull-up circuit 41B is provided.

That is, p-channel MISFETs P4-L, P4-R are connected between the bit lines BL-L, BL-R and the p-channel MISFETs P1-L, P1-R, and the gate electrodes of these (P4-L, P4-R) are connected via the capacitance C9 to the signal line vupb. Put differently, the p-channel MISFETs P4-L, P4-R are connected in parallel respectively with the p-channel MISFETs T2-L, T2-R. Otherwise the configuration is similar to that of Embodiment 5 (FIG. 14). As the capacitance C9, a paraelectric capacitance is used, but a ferroelectric capacitance may be used.

Next, readout operation of a ferroelectric memory device having the above sense amplifier circuit is explained. Operation of the various signals and similar is the same as in Embodiment 5 (FIG. 15, FIG. 16). Hence here, operation of the circuit 41B after the change in the control signal Vup to H level (the change in control signal Vupb to L level) is explained.

That is, after a fixed interval (for example, after interval t2 from the falling edge of the signal Vblm), when the control signal Vup goes to H level, the control signal Vupb goes to L level, and p-channel MISFETs P4-L, P4-R enter the on state. Hence the potential of the first node Vmn-L and second node Vmn-R, which are at negative potential, can be raised. Thereafter, the node Vmn-R at higher potential reaches the threshold potential (Vth) of the p-channel MISFETs P1-L, P1-R first, and the p-channel MISFET on the other side is turned off.

In this way, in this embodiment also, advantageous results similar to those of Embodiment 5 are obtained. That is, by means of the circuit to accommodate large amounts of charge 30, rises in the potential of one among the first node Vmn-L and second node Vmn-R are suppressed, so that a large potential difference therebetween can be secured. Hence the readout margin can be improved.

Further, the pull-up circuit 41B can raise the potential of the first node Vmn-L and second node Vmn-R to the potential at which the circuit 30 operates. And, the potential of the first node Vmn-L and second node Vmn-R can be raised while reflecting the potential difference between the bit lines BL-L and BL-R. Hence the readout margin can be further improved. Also, even when a bit line potential has been dropped too sharply to a negative potential, a pull-up circuit can cause the potential of the first node Vmn-L and second node Vmn-R to be raised to the potential at which the circuit 30 operates.

Embodiment 7

In place of the pull-up circuits 41A-L, 41A-R of Embodiment 5 (FIG. 14), the pull-up circuits (40, 40A, 40B) of Embodiments 2 through 4 (FIG. 7, FIG. 12 and FIG. 13) may be applied.

Figure 23:
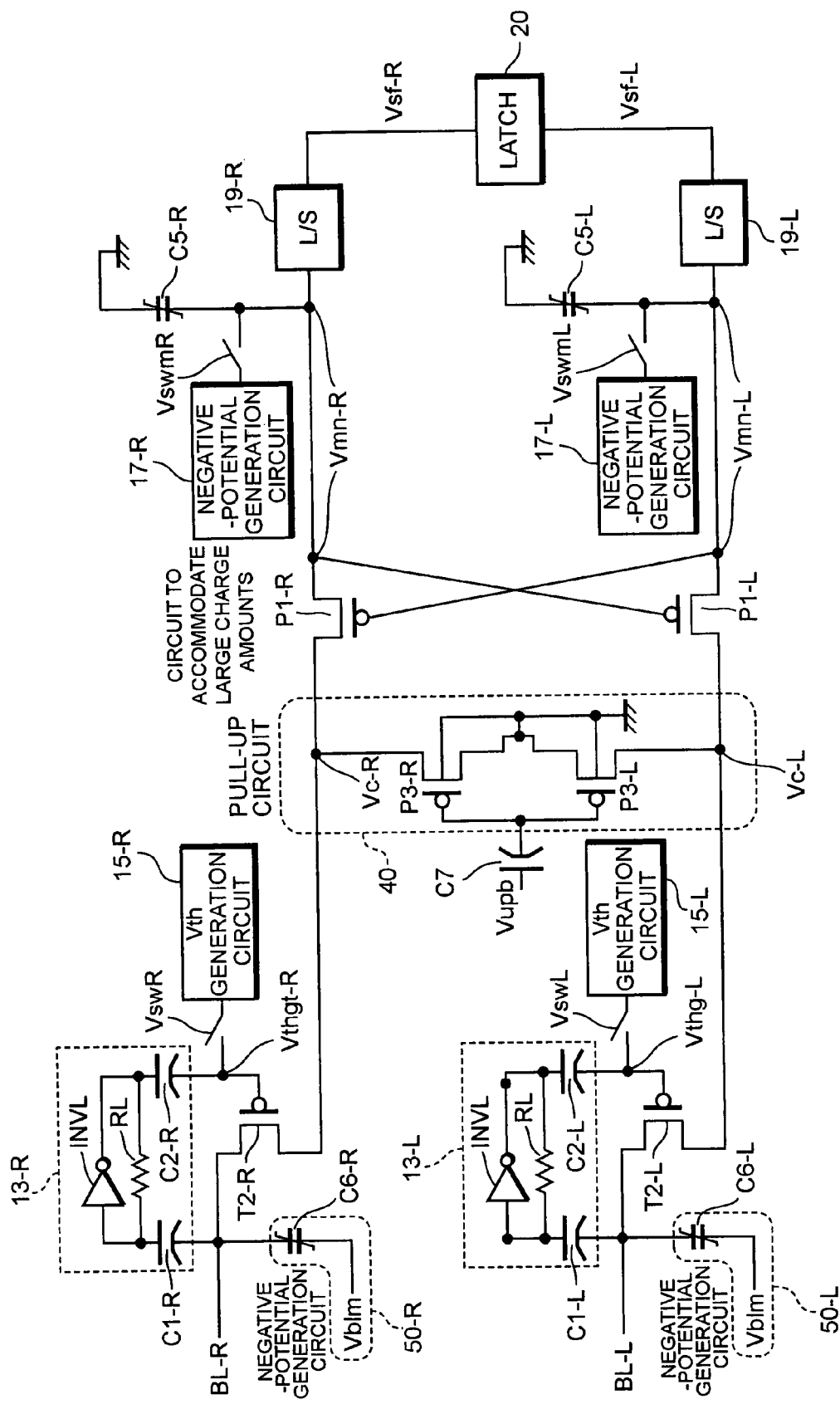
FIG. 23 is a circuit diagram showing the configuration of the sense amplifier (readout circuit) of Embodiment 7.
Figure 24:
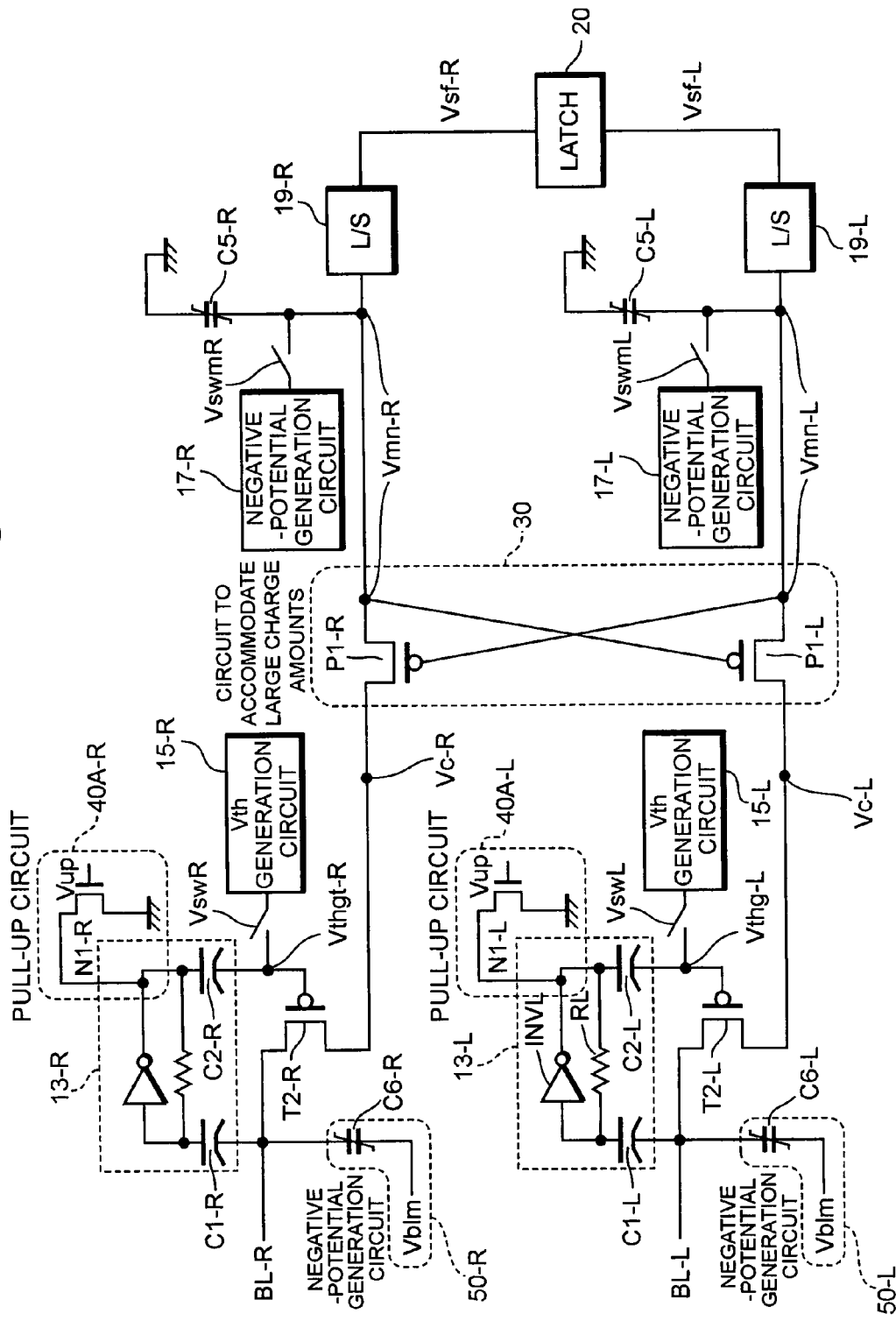
FIG. 24 is a circuit diagram showing the configuration of the sense amplifier (readout circuit) of Embodiment 7.
Figure 25:
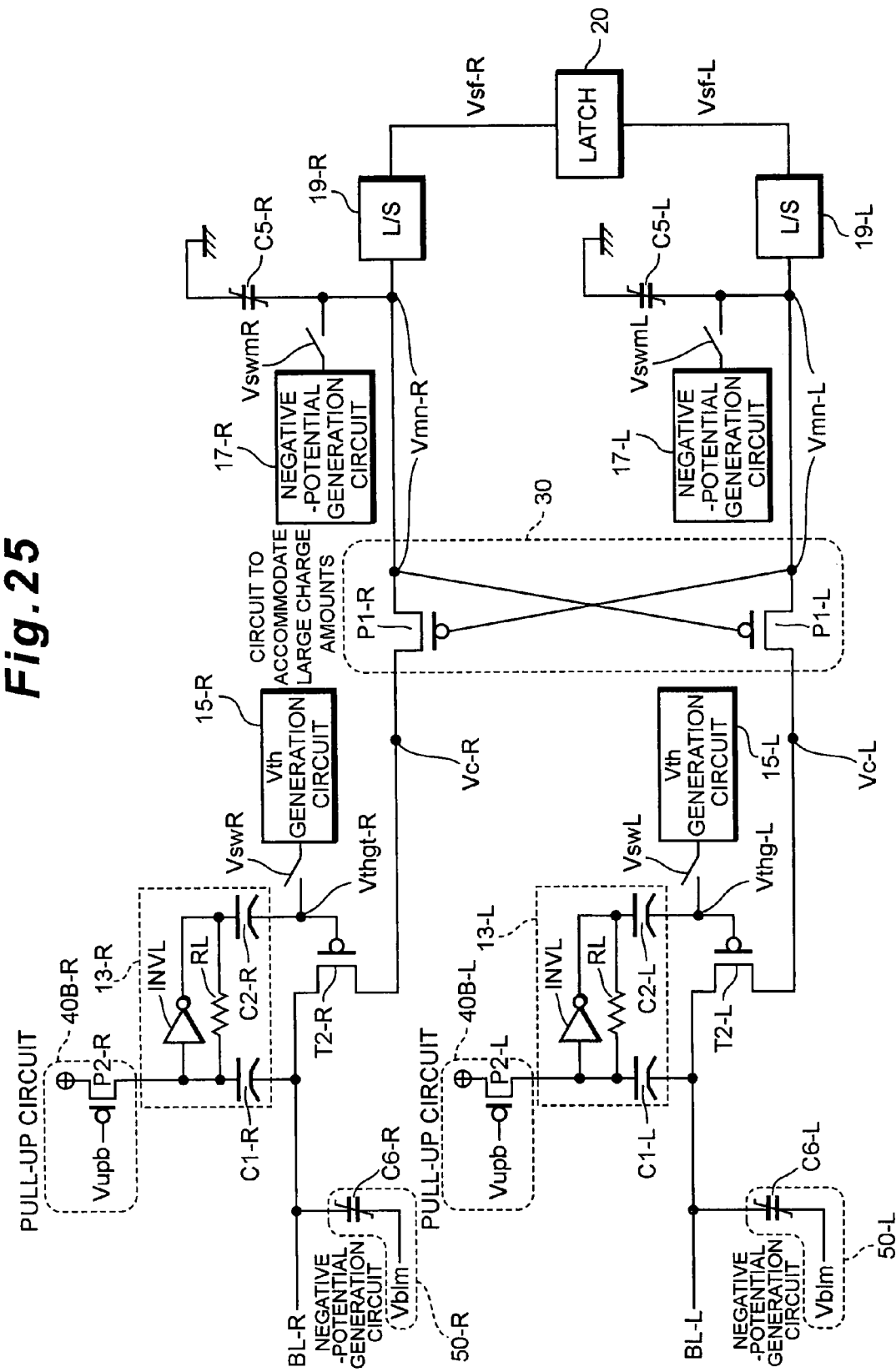
FIG. 25 is a circuit diagram showing the configuration of the sense amplifier (readout circuit) of Embodiment 7.

FIG. 23 through FIG. 25 are circuit diagrams showing the configuration of the sense amplifier circuits (readout circuits) of this embodiment.

APPLICATION EXAMPLE 1

As shown in FIG. 23, instead of the pull-up circuits 41A-L, 41A-R of Embodiment 5 (FIG. 14), the pull-up circuit (40) of Embodiment 2 (FIG. 7) may be provided.

That is, the p-channel MISFETs P3-L P3-R are connected to the third node Vc-L and fourth node Vc-R, which are connection nodes between the p-channel MISFETs T2-L, T2-R and the p-channel MISFETs P1-L, P1-R.

Specifically, the p-channel MISFET P3-L is connected between the third node Vc-L and ground potential, and the p-channel MISFET P3-R is connected between the fourth node Vc-R and ground potential. The gate electrodes of the p-channel MISFETs P3-L and P3-R are connected, via the capacitance C7, to the signal line Vupb. The back gates of the p-channel MISFETs P3-L and P3-R are connected to ground potential. By means of these connections, leakage currents to the substrate can be reduced. Here, a paraelectric capacitance is used as the capacitance C7, but a ferroelectric capacitance may be used.

APPLICATION EXAMPLE 2

As shown in FIG. 24, instead of the pull-up circuits 41A-L, 41A-R of Embodiment 5 (FIG. 14), the pull-up circuits (40A-L, 40A-R) of Embodiment 3 (FIG. 12) are provided.

That is, the n-channel MISFET N1-L is connected between the output portion of the inverter INVL and ground potential, and the n-channel MISFET N1-R is connected between the output portion of the inverter INVR and ground potential. The gate electrodes of these n-channel MISFETs N1-L, N1-R are connected to the signal line Vup.

APPLICATION EXAMPLE 3

As shown in FIG. 25, instead of the pull-up circuits 41A-L, 41A-R of Embodiment 5 (FIG. 14), the pull-up circuits (40B-L, 40B-R) of Embodiment 3 (FIG. 13) may be provided.

That is, the p-channel MISFET P2-L is connected between the input portion of the inverter INVL and the power supply potential (driving potential, Vcc, Vdd), and the p-channel MISFET P2-R is connected between the input portion of the inverter INVR and the power supply potential. The gate electrodes of these p-channel MISFETs P2-L, P2-R are connected to the signal line Vupb.

In the circuits of the above Application Examples 1 through 3 (FIG. 23 and FIG. 24) also, by means of pull-up circuits, the potential of the first node Vmn-L and second node Vmn-R, which are at negative potential, can be made to rise to the potential at which the circuit 30 operates (see Embodiments 2 through 4).

Further, even when a bit line potential is dropped too sharply to a negative potential, by means of a pull-up circuit, the potential of the first node Vmn-L and second node Vmn-R can be made to rise to the potential at which the circuit 30 operates.

In the above Embodiments 5 through 7, so-called 2T2C ferroelectric memory devices were explained; but this invention can also be applied to 1T1C ferroelectric memory devices.

Further, the pull-up circuits explained in Embodiments 5 and 6 (41A, 41B) may be applied to the circuit of Embodiment 1 (FIG. 2). And, the negative-potential generation circuit 50 explained in Embodiment 5 may be applied to the circuit of Embodiment 1 (FIG. 2).

In this way, examples and application examples explained through the above embodiments of the invention may be combined, or modified, or improved appropriately according to the application, and the invention is not limited to the above-described embodiments.

What is claimed is:

1. A ferroelectric memory device, comprising:
    a first charge-transfer MISFET, connected between a first bit line and a first node;
    a second charge-transfer MISFET, connected between a second bit line and a second node;
    a first capacitance, connected to the first node;
    a second capacitance, connected to the second node;
    a first p-channel MISFET, connected between the first charge-transfer MISFET and the first node, and the gate electrode of which is connected to the second node; and
    a second p-channel MISFET, connected between the second charge-transfer MISFET and the second node, and the gate electrode of which is connected to the first node.

2. The ferroelectric memory device according to claim 1, wherein the first and second charge-transfer MISFETs are both p-channel MISFETs.

3. The ferroelectric memory device according to claim 1, further comprising:
    a first inverter, connected between the first bit line and the gate electrode of the first charge-transfer MISFET, the input portion of which is connected to the first bit line via a third capacitance, and the output portion of which is connected to the gate electrode of the first charge-transfer MISFET via a fourth capacitance; and
    a second inverter, connected between the second bit line and the gate electrode of the second charge-transfer MISFET, the input portion of which is connected to the second bit line via a fifth capacitance, and the output portion of which is connected to the gate electrode of the second charge-transfer MISFET via a sixth capacitance.

4. The ferroelectric memory device according to claim 1, further comprising:
    a third p-channel MISFET, connected between a third node, which is a connection node between the first charge-transfer MISFET and the first p-channel MISFET, and a ground potential; and
    a fourth p-channel MISFET, connected between a fourth node, which is a connection node between the second charge-transfer MISFET and the second p-channel MISFET, and a ground potential.

5. The ferroelectric memory device according to claim 4, wherein the third and fourth p-channel MISFETs are controlled so as to be in the on state after a fixed interval from the start of a readout operation of the device.

6. The ferroelectric according to claim 3, further comprising:
    a first n-channel MISFET, connected between the output portion of the first inverter and a ground potential; and
    a second n-channel MISFET, connected between the output portion of the second inverter and a ground potential.

7. The ferroelectric memory device according to claim 6, wherein the first and second n-channel MISFETs are controlled so as to be in the on state after a fixed interval from the start of a readout operation of the device.

8. The ferroelectric memory device according to claim 3, further comprising:
    a fifth p-channel MISFET, connected between the input portion of the first inverter and a power supply potential; and
    a sixth p-channel MISFET, connected between the output portion of the second inverter and a power supply potential.

9. The ferroelectric memory device according to claim 8, wherein the fifth and sixth p-channel MISFETs are controlled so as to be in the on state after a fixed interval from the start of a readout operation of the device.

10. The ferroelectric memory device according to claim 1, wherein the first and second capacitances are ferroelectric capacitances or gate capacitances.

11. The ferroelectric memory device according to claim 1, wherein the first bit line is connected to a first ferroelectric memory, and the second bit line is either connected to a second ferroelectric memory or applied with a reference potential.

12. Electronic equipment, comprising the ferroelectric memory device according to claim 1.

13. A ferroelectric memory device, comprising:
a first p-channel MISFET, connected between a first node and a third node, and the gate electrode of which is connected to a second node;
a second p-channel MISFET, connected between the second node and a fourth node, and the gate electrode of which is connected to the first node;
a first charge-transfer MISFET, connected between a first bit line and the third node;
a second charge-transfer MISFET, connected between a second bit line and the fourth node;
a first control circuit, which is connected between the first bit line and a first gate electrode of the first charge-transfer MISFET, and which controls a potential applied to the first gate electrode according to the potential of the first bit line;
a second control circuit, which is connected between the second bit line and a second gate electrode of the second charge-transfer MISFET, and which controls a potential applied to the second gate electrode according to the potential of the second bit line;
a first capacitance, connected to the first node;
a second capacitance, connected to the second node;
a first negative-potential generation circuit, connected to the first bit line; and
a second negative-potential generation circuit, connected to the second bit line.

14. The ferroelectric memory device according to claim 13, wherein the first and second charge-transfer MISFETs are both p-channel MISFETs.

15. The ferroelectric memory device according to claim 13, wherein the first control circuit has a first inverter, connected between the first bit line and the gate electrode of the first charge-transfer MISFET, the input portion of which is connected to the first bit line via a third capacitance, and the output portion of which is connected to the gate electrode of the first charge-transfer MISFET via a fourth capacitance, and the second control circuit has a second inverter, connected between the second bit line and the gate electrode of the second charge-transfer MISFET, the input portion of which is connected to the second bit line via a fifth capacitance, and the output portion of which is connected to the gate electrode of the second charge-transfer MISFET via a sixth capacitance.

16. The ferroelectric memory device according to claim 13, wherein the first negative-potential generation circuit has a seventh capacitance connected between the first bit line and a first signal line, and the second negative-potential generation circuit has an eighth capacitance connected between the second bit line and the first signal line.

17. The ferroelectric memory device according to claim 16, wherein the seventh and eighth capacitances are ferroelectric capacitances.

18. The ferroelectric memory device according to claim 17, wherein the first bit line and second bit line are each connected to ferroelectric memory, and the seventh and eighth capacitances have substantially the same capacitance as the ferroelectric capacitances of the ferroelectric memory.

19. The ferroelectric memory device according to claim 15, further comprising:
a first n-channel MISFET, connected between the output portion of the first inverter and a ground potential; and
a second n-channel MISFET, connected between the output portion of the second inverter and a ground potential.

20. The ferroelectric memory device according to claim 19, further comprising:
a third n-channel MISFET, connected between the output portion of the first inverter and the first n-channel MISFET, and the gate electrode of which is connected to the input portion of the first inverter; and
a fourth n-channel MISFET, connected between the output portion of the second inverter and the second n-channel MISFET, and the gate electrode of which is connected to the input portion of the second inverter.

21. The ferroelectric memory device according to claim 19, wherein the first and second n-channel MISFETs are controlled so as to be in the on state after a fixed interval from the start of operations of the first and second negative-potential generation circuits.

22. The ferroelectric memory device according to claim 13, further comprising:
a third charge-transfer MISFET, connected in parallel with the first charge-transfer MISFET, and the gate electrode of which is connected to a second signal line; and
a fourth charge-transfer MISFET, connected in parallel with the second charge-transfer MISFET, and the gate electrode of which is connected to the second signal line.

23. The ferroelectric memory device according to claim 13, further comprising:
a third p-channel MISFET, connected between the third node and a ground potential, and the gate electrode of which is connected to a second signal line; and
a fourth p-channel MISFET, connected between the fourth node and a ground potential, and the gate electrode of which is connected to the second signal line.

24. The ferroelectric memory device according to claim 15, further comprising:
a fifth p-channel MISFET, connected between the input portion of the first inverter and a power supply potential, and the gate electrode of which is connected to a second signal line; and
a sixth p-channel MISFET, connected between the input portion of the second inverter and a power supply potential, and the gate electrode of which is connected to the second signal line.

25. The ferroelectric memory device according to claim 22, wherein the potential of the second signal line is controlled so as to change after a fixed interval from the start of operations of the first and second negative-potential generation circuits.

* * * * *